US010008994B2

(12) United States Patent
Berkhout et al.

(10) Patent No.: US 10,008,994 B2
(45) Date of Patent: Jun. 26, 2018

(54) AUDIO AMPLIFIER SYSTEM

(71) Applicant: NXP B.V., Eindhoven (NL)

(72) Inventors: Marco Berkhout, Tiel (NL); Lûtsen Ludgerus Albertus Hendrikus Dooper, Brummen (NL); Maarten van Dommelen, Nijmegen (NL); Han Martijn Schuurmans, Cuijk (NL)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/480,645

(22) Filed: Apr. 6, 2017

(65) Prior Publication Data

US 2017/0294888 A1 Oct. 12, 2017

(30) Foreign Application Priority Data

Apr. 6, 2016 (EP) .................................... 16164084

(51) Int. Cl.
*H03G 3/30* (2006.01)
*H03F 1/02* (2006.01)
(Continued)

(52) U.S. Cl.
CPC ......... *H03G 3/3015* (2013.01); *H03F 1/0227* (2013.01); *H03F 3/185* (2013.01);
(Continued)

(58) Field of Classification Search
CPC .. H03G 3/3015; H03G 3/3089; H03F 1/0227; H03F 3/185; H03F 3/2175; H03F 2200/03; H03F 2200/102; H03F 2200/351
See application file for complete search history.

(56) References Cited

U.S. PATENT DOCUMENTS 5,870,049 A 2/1999 Huang et al.
6,255,974 B1 7/2001 Morizio et al.
(Continued)

FOREIGN PATENT DOCUMENTS

WO WO-2012/139665 A1 10/2012

OTHER PUBLICATIONS

Kim, Yi-Gyeong et al; "A Hybrid Audio ΔΣ Modulator with dB-Linear Gain Control Function"; ETRI Journal, vol. 33, No. 6; pp. 897-903 (Dec. 1, 2011).
(Continued)

*Primary Examiner* — Sonia Gay

(57) ABSTRACT

An audio amplifier system is described comprising: a variable gain audio processor for processing digital audio signal, a digital to analog converter coupled to the audio processor, and configured to receive the processed digital audio signal, a variable gain amplifier having an input coupled to the output of the digital to analog converter and operably connected to a power supply, a controller coupled to the variable gain audio processor and the variable gain amplifier and configured to switch the audio amplifier system between a first operating mode having a first power supply voltage value and a second operating mode having a second higher power supply voltage value; wherein the controller is operable in the first operating mode to set the audio amplifier system gain to a desired gain value and in the second operating mode to maintain the desired gain value.

14 Claims, 25 Drawing Sheets

(51) Int. Cl.
*H03F 3/185* (2006.01)
*H03F 3/217* (2006.01)

(52) U.S. Cl.
CPC ......... *H03F 3/2175* (2013.01); *H03G 3/3089* (2013.01); *H03F 2200/03* (2013.01); *H03F 2200/102* (2013.01); *H03F 2200/351* (2013.01)

(56) References Cited

U.S. PATENT DOCUMENTS

| | | | | |
|---|---|---|---|---|
| 6,567,025 | B2 | 5/2003 | Schreier et al. | |
| 7,268,715 | B2 | 9/2007 | Guimaraes | |
| 7,825,841 | B2 | 11/2010 | Sundstrom et al. | |
| 2006/0164272 | A1 | 7/2006 | Philips et al. | |
| 2008/0116979 | A1* | 5/2008 | Lesso | H02M 3/07 330/297 |
| 2009/0220110 | A1 | 3/2009 | Bazarjani et al. | |
| 2011/0025537 | A1 | 2/2011 | Kim et al. | |
| 2012/0188111 | A1 | 7/2012 | Ledzius et al. | |
| 2013/0208922 | A1* | 8/2013 | Nicollini | H03F 1/30 381/120 |
| 2015/0249466 | A1* | 9/2015 | Elyada | H03M 1/70 341/144 |
| 2015/0263686 | A1 | 9/2015 | Lesso | |
| 2015/0295584 | A1 | 10/2015 | Das et al. | |

OTHER PUBLICATIONS

Dooper, Lutsen et al; “A 3.4 W. Digital-In Class-D Audio Amplifier in 0.14um CMOS”; IEEE J. Solid State Circuits, vol. 47, No. 7; pp. 1524-1534 (Jul. 2012).

“ITU-R 468 noise weighting”; retrieved from the internet http://en.wikipedia.org/wiki/ITU-R_468_noise_weighting; 6 pages retreived Feb. 27, 2017.

Berkhout, Marco et al; “A 4 2.65W Class-D Audio Amplifier with Embedded DC-DC Boost Convert, Current Sensing ADC and DSP for Adaptive Speaker Protection”; IEEE J. of Solid-State circuits vol. 48 No. 12 pp. 2952-2961 (Dec. 2013).

NXP Semiconductors; TFA9887—Audio System with Adaptive Sound Maximizer and Speaker Protection; Rev.1—Product Short Datasheet; 20 pages (Jul. 11, 2012).

* cited by examiner

AUDIO AMPLIFIER SYSTEM

CROSS-REFERENCE TO RELATED APPLICATIONS

This application claims the priority under 35 U.S.C. § 119 of European patent application no. 16164084.2, filed Apr. 6, 2016 the contents of which are incorporated by reference herein.

FIELD

This disclosure relates to audio amplifier systems.

BACKGROUND

The acquisition and reproduction of audio signals was among the first applications of electronic circuits. Nowadays, audio electronics are ubiquitous and can be found in television and hifi-stereo sets, car audio systems and more recently in cellular phones and many other portable applications. The vast majority of these electronics is in the form of integrated circuits. Audio amplifier systems may be used in mobile phones and other mobile devices. An example audio amplifier system also referred to as a smart speaker driver maximizes acoustic output while ensuring that the speaker is not damaged. This is done by predicting the membrane excursion and estimating the voice-coil temperature by means of a speaker model. The membrane excursion is directly related to sound pressure level. Differences between the speaker model and the real world are eliminated by feeding back real-time measurement of the current going into the speaker.

The heart of the smart speaker driver is a high efficiency class-D amplifier that drives the actual loudspeaker. The amplifier is supplied by a DC-DC boost converter that guarantees high output power even at low battery voltage. The DC-DC boost converter is controlled from the digital domain and is only enabled when high power is needed at the amplifier output. The combined efficiency of the DC-DC boost converter and amplifier is optimized by doing a coarse envelope tracking of the audio signal.

SUMMARY

Various aspects of the disclosure are defined in the accompanying claims. In a first aspect there is defined an audio amplifier system comprising: a variable gain audio processor configured to receive a digital audio signal and output a processed digital audio signal, a digital to analog converter coupled to the audio processor, and configured to receive the processed digital audio signal, a variable gain amplifier having an input coupled to the output of the digital to analog converter and operably connected to a power supply having at least two power supply values, a controller coupled to the variable gain audio processor and the variable gain amplifier and configured to switch the audio amplifier system between a first operating mode having a first power supply voltage value and a second operating mode having a second higher power supply voltage value; wherein the controller is operable in the first operating mode to set the audio amplifier system gain to a predetermined gain value and in the second operating mode to maintain the amplifier system gain at the predetermined gain value by increasing the gain of the variable gain amplifier and decreasing the gain of the variable gain audio processor with respect to the first operating mode.

In embodiments the controller may be further operable to maintain the audio amplifier system gain by altering the gain of the variable gain amplifier by a gain factor and altering the gain of the variable gain audio processor by the reciprocal of the gain factor. By maintaining the gain, the overall gain of the audio amplifier system is the same within typical engineering tolerances which may be +−1% between the two operating modes. When switching between the two modes the gain is maintained such that no change in the audio output can be perceived by the user.

In embodiments the gain correction factor may be an integer power of two.

In embodiments the digital to analog converter may be a current mode digital to analog converter operably supplied with a reference current.

In embodiments the controller may be further operable to switch from the second mode of operation to the first mode of operation and to maintain the amplifier system gain at the predetermined value by decreasing the gain of the variable gain amplifier and increasing the gain of the variable gain audio processor with respect to the second mode of operation.

In embodiments of the audio amplifying system, the variable gain amplifier may be a class-D amplifier. The variable gain class-D amplifier may comprise a pair of differential inputs, a pair of differential outputs and a pair of variable resistances each variable resistance coupled between a respective one of the differential outputs and the differential inputs. The variable resistance may be coupled to the controller. The controller may be operable to control the gain of the variable gain class-D amplifier by varying feedback resistance value.

In embodiments, each variable resistance may comprise a series and/or parallel arrangement of a first fixed resistance and at least one further switchable resistance coupled to the controller.

In embodiments of the audio amplifier system, the variable gain audio processor may further comprise a sigma-delta modulator which may function as a noise shaper.

In embodiments of the audio amplifier system, the variable gain audio processor may comprise a gain corrector coupled to the controller, the gain corrector being selectable to increase the gain of the digital audio signal by a gain factor in the first operating mode and to apply a unity gain to the digital audio signal in the second operating mode.

In embodiments, the sigma-delta modulator may comprise the gain corrector arranged between a loop filter and a quantizer and a further gain corrector arranged in the feedback path of the sigma-delta modulator and coupled to the controller, wherein the further gain corrector is selectable to attenuate the processed digital audio signal by the gain factor in response to the power supply voltage changing to the second lower value.

In embodiments the controller may comprise a detector coupled to the output of sigma-delta modulator. The controller may be further operable to vary the gain in response to a predetermined number of consecutive zeros being detected in the processed digital signal.

In embodiments, the audio amplifier system may further comprise a synchronous delay element coupled to the output of the gain corrector and a delay error corrector coupled to the output of the delay element, the delay error corrector being configured to correct the delayed signal by dividing the signal from the delay element by the gain correction factor for a single clock cycle in response to the power supply voltage changing from the first power supply voltage value to the second higher power supply voltage value, and multiplying the signal from the delay element by the gain correction factor for a single clock cycle in response to the power supply voltage changing from the second power supply voltage value to the first power supply voltage value and outputting the delayed corrected signal to the digital to analog converter.

In embodiments of the audio amplifier system including a loop filter, the loop filter may comprise the delay error corrector.

In embodiments of the audio amplifier system, the first operating mode may be a low power operating mode and the second operating mode may be a high power operating mode and wherein the controller is coupled to a dc-dc converter and is operable to switch the audio amplifier system between the low power operating mode and the high power operating mode in response to an increase in the level of the digital audio signal.

BRIEF DESCRIPTION OF DRAWINGS

In the figures and description like reference numerals refer to like features. Embodiments of the invention are now described in detail, by way of example only, illustrated by the accompanying drawings in which:

FIG. 9A shows arrangements for gain correctors and adders/subtractors. FIG. 9B shows arrangements for gain correctors and a gain element. FIG. 9C shows arrangements for gain correction in branch topologies.

DESCRIPTION

Figure 1:
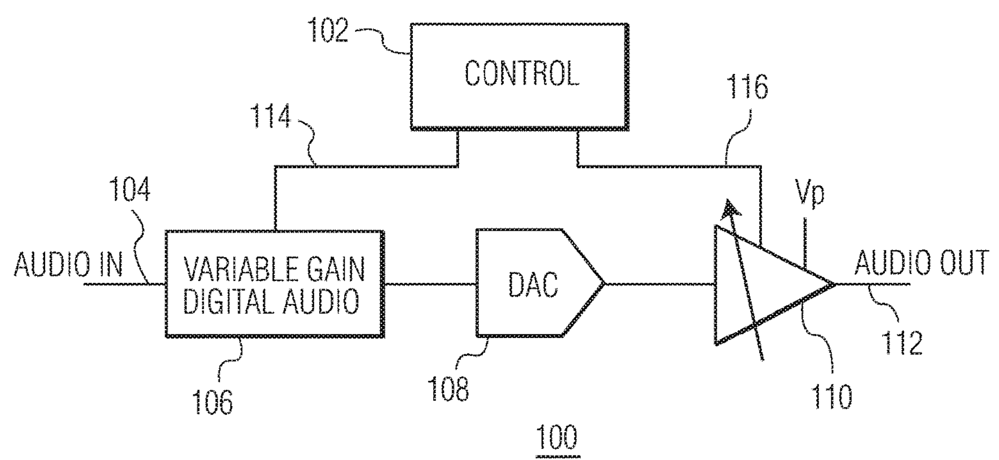
FIG. 1 shows an audio amplifier system according to an embodiment.

FIG. 1 shows an audio amplifier system 100 having an audio input terminal 104 connected to a variable gain digital audio processor 106. The output of the variable gain digital audio processor 106 is connected to a digital-to-analog converter 108. An output of the digital-to-analog converter 108 may be connected to an input of a variable gain amplifier 110 which may be a class AB or a class D audio amplifier. The gain may be varied continuously or in discrete steps. The gain may be varied between two or more values. The output of the variable gain amplifier 110 may be connected to the audio output terminal 112 for connection to a loudspeaker (not shown) when in operation. A controller 102 may be connected to the variable gain digital audio processor 106 by a first control line 114 and the variable gain audio amplifier 110 by a second control line 116. In other examples the first control line 114 and 116 second control line may be combined. The variable gain digital audio processor 106 may be implemented in hardware, software or a combination of hardware and software. The variable gain amplifier 110 may be implemented as an analog hardware circuit. The controller 102 may be implemented in hardware, software or a combination of hardware and software. The elements in the audio path prior to the digital to analog converter may be collectively referred to as the digital front end or digital audio path. The elements in the audio path after the digital to analog converter may be collectively referred to as the analog back end or analog audio path.

In operation of the audio amplifier system 100, the power supplied to the audio amplifier may be varied between voltage supply values dependent on the input signal levels. The audio amplifier system 100 may include a DC-DC boost converter (not shown) powered by a battery to temporarily increase the power supplied by the variable gain amplifier 110 in order to handle higher input signal values. When increased power is not required, the DC-DC boost converter may follow the battery voltage. The audio amplifier system 100 may have a first operating mode, for example a low power mode, where the supply voltage Vp is at a first value and a second operating mode where the supply voltage is at a second, higher value. In the first operating mode the controller may set the gain of the audio amplifier system 100 to a desired overall gain of the audio signal between the digital audio input 104 and the analog audio output 112 by controlling the gain of the variable gain digital audio processor 106 and the variable gain amplifier 110. If the power required by the variable gain audio amplifier increases which may be determined for example from the signal level of the audio input 104, the controller may increase the gain of the of the variable gain audio amplifier 110 by a predetermined gain correction factor and reduce the gain of the variable gain digital audio processor by the same gain correction factor. In this way the overall predetermined or desired system gain may be maintained. In this context, the same gain factor means the same gain factor within accepted engineering tolerances which are typically less than 1%. In this example, the controller 102 switches between two operating modes. As will be appreciated, in other example audio amplifier systems, the controller may switch between more than two operating modes.

By having a larger proportion of the overall gain in the digital domain at lower power supply values the overall noise in the amplifier system may be reduced. At higher power supply values the noise may increase but since the high power operating mode may only be selected at larger input signal values, the overall signal to noise ratio of the audio amplifier system may still be improved.

Figure 2:
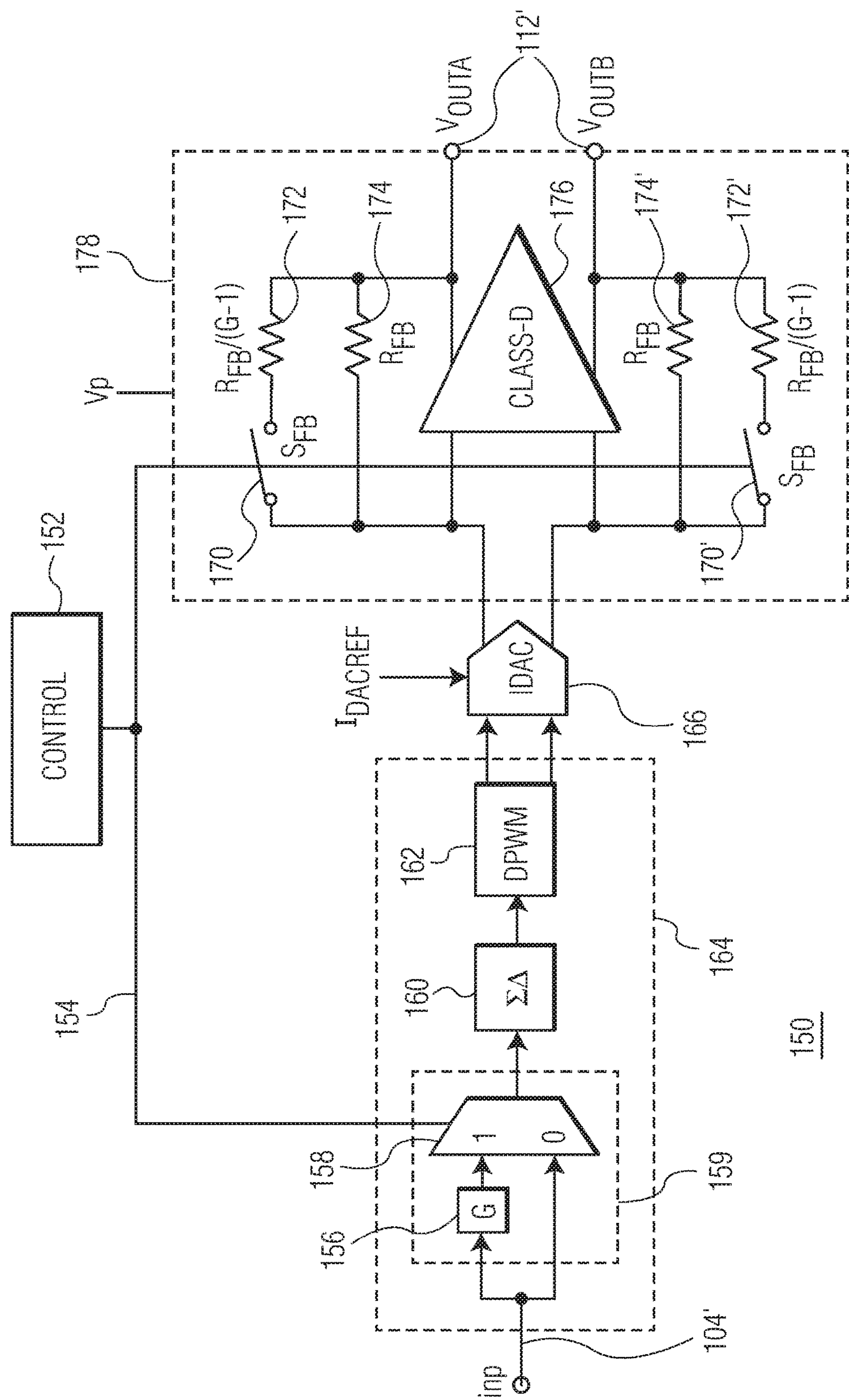
FIG. 2 illustrates an audio amplifier system according to an embodiment.

FIG. 2 shows an audio amplifier system 150. A variable gain digital audio processor 164 may include a gain corrector 159 including a gain correction module 156 and a multiplexer 158. The gain correction module 156 may have an input coupled to the digital audio input 104' and an output connected to a first input of a multiplexer 158. The digital audio input 104' may be connected to a second input of the multiplexer 158. A control input of the multiplexer 158 may have a connection 154 to a controller 152. The gain correction module 156 may apply a gain factor denoted G to the input signal. The gain correction module 156 may for example multiply the incoming digital audio signal with an integer value. In cases where the gain factor is a power of two, the gain correction module 156 may be implemented by a shift operation of the digital audio data which may simplify the implementation. The variable gain digital audio processor 164 may further include a series arrangement of a noise shaper 160 which may be a sigma delta modulator and a pulse width modulation generator 162. The input of the noise shaper 160 may be connected to the output of the multiplexer 158. The digital pulse width modulator 162 may have a differential pair of outputs coupled to a current-mode digital-to-analog converter (iDAC) 166. The current-mode digital to analog converter may have a pair of differential outputs connected to a class-D amplifier circuit 176 having a pair of differential inputs and a pair of differential outputs 112'.

In operation, the differential outputs 112' may be used to drive a speaker or loudspeaker (not shown). A feedback path between each respective differential output and differential input has a fixed resistance 174,174' in parallel with a series arrangement of feedback switches 170,170' and resistances 172,172'. Resistances 172,172' may be referred to as switchable resistances. The series arrangement of the respective switches 170,170' and switchable resistances 172,172' may also be considered as a switchable resistor. It will be appreciated that for example the switches 170,170' may be implemented as transistors such as MOS or bipolar transistors. The feedback switches 170,170' have a control input connected by control line 154 to the controller 152. In other examples the feedback path may use resistances in series and change the feedback value by partially short-circuiting the feedback resistors with parallel switches. The value of each of the fixed resistances 174,174' may be equal to each other, and denoted as $R_{FB}$. The value of each of the switchable resistances 172,172' may be a value of $R_{FB}/(G-1)$ where G is a value of gain factor which may be an integer value. The class-D amplifier circuit 176, fixed resistances 174,174', switches 170, 170' and switchable resistances 172, 172' may form a variable gain class-D amplifier 178.

In operation, the variable gain class-D amplifier 178 may be connected to a speaker (not shown). The variable gain class-D amplifier 178 may be connected to a power supply having a voltage $V_p$ which may vary depending on the power required by the variable gain class-D amplifier 178. The iDAC 166 may be supplied by a constant current reference $I_{DACREF}$ which has a value that may be determined from the maximum value of the supply voltage $V_p$. It will be appreciated that the other circuitry in the amplifier system 150 may be supplied at a voltage $V_p$ or a different, lower supply voltage dependent on the power requirements.

In a first operation mode, which may be termed a low power operation mode, the voltage $V_p$ may be at a first level which may for example be the voltage from a battery power source. In this first low power operation mode, the controller 152 may control the gain corrector 159 to connect the input of the noise shaper 160 to the output of the gain correction module 156 which applies a gain factor G to the digital audio input signal. The controller 152 may close the respective switches 170,170' the switchable resistances 172,172' by controlling the respective switches 170,170'. In this case the effective feedback resistance value is that of the fixed resistances 174, 174' ($R_{FB}$) in parallel with that of the respective switchable resistors 172,172' ($R_{FB}/(G-1)$) that is to say an effective value of $R_{FB}/G$. The class-D amplifier gain is linearly dependent on the feedback resistance value, and hence the gain of the variable gain class-D amplifier 178 decreases by a factor of G.

In a second operation mode, which may be termed a high power operation mode, the voltage $V_p$ may be at a second higher level which may for example be a boosted supply voltage from a battery power source. The supply voltage may be boosted by a DC boost converter (not shown). In this second high power operation mode, the controller 152 may control the gain corrector 159 to connect the input of the noise shaper 160 directly to the digital audio input. Consequently the gain applied at this stage is reduced by a factor of G compared to the first low power operation mode. The controller 152 may open circuit the switchable resistances 172,172' by controlling the respective switches 170,170'. In this case the effective feedback resistance value is that of the fixed resistances 174, 174', that is to say $R_{FB}$ which is a gain increase of a factor G compared with the first operation mode. Consequently the overall gain of the amplifier system 150 remains the same as the first low power operation mode.

By having a larger proportion of the overall gain in the digital domain at lower power supply values the overall noise in the amplifier system 150 may be reduced. At higher power supply values the noise may increase but since the high power operating mode may only be selected at larger input signal values, the overall signal to noise ratio of the audio amplifier system may still be the same.

Figure 3:
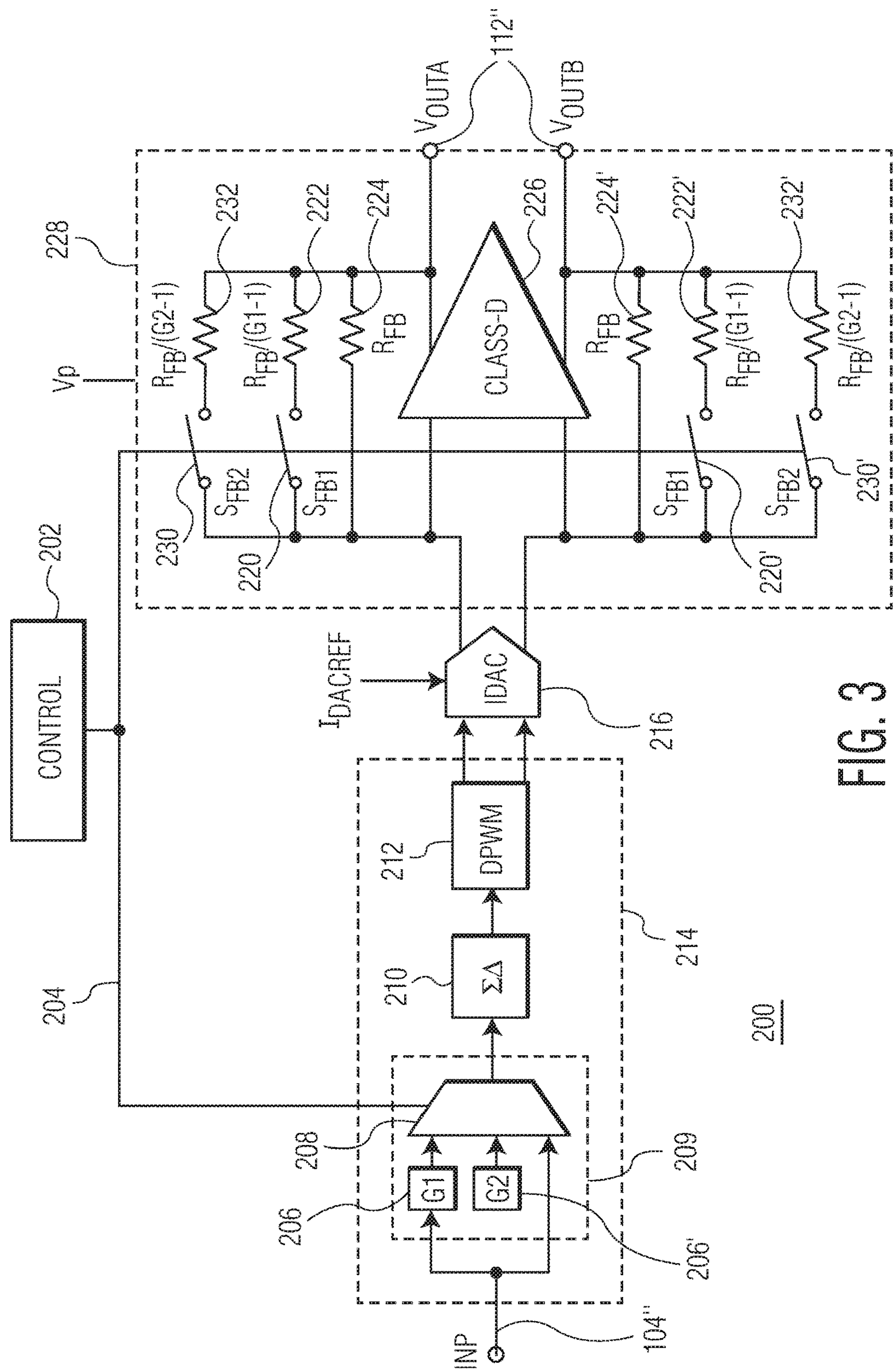
FIG. 3 shows an audio amplifier system according to an embodiment.

FIG. 3 shows an audio amplifier system 200. A variable gain digital audio processor 214 may include two gain correction modules 206, 206' and a multiplexer forming a gain corrector 209. Each of the gain correction modules 206,206' have an input coupled to the digital audio input 104" and an output connected to a respective input of a multiplexer 208. The digital audio input 104" may be connected to a further input of the multiplexer 208. A control input of the multiplexer 208 may be connected to a controller 202. The gain correction modules 206,206' may apply a respective gain factor denoted G1, and G2 to the input signal. The gain correction modules 206, 206' may for example multiply the incoming digital audio signal with an integer value. In cases where the gain factor is a power of two, the gain correction modules 206,206' may implement a shift operation of the digital audio data. The variable gain digital audio processor 214 may further include a series arrangement of a noise shaper 210 which may be a sigma delta modulator and a pulse width modulation generator 212. The input of the noise shaper 210 may be connected to the output of the multiplexer 208. The digital pulse width modulator 212 may have a differential pair of outputs coupled to a current-mode digital-to-analog converter (iDAC) 216. The current-mode digital-to-analog converter 216 may have a pair of differential outputs connected to a class-D amplifier circuit 226 having a pair of differential inputs and a pair of differential outputs 112". In operation, the differential outputs 112" may be used to drive a speaker or loudspeaker (not shown). A feedback path between each respective differential output and differential input has a parallel arrangement of (i) a fixed resistance 224,224', (ii) a first series arrangement of a respective feedback switch 220,220' and resistances 222,222', and (iii) a second series arrangement of a respective feedback switch 230,230' and resistances 232,232' which may be referred to herein as switchable resistances. The value of each of the fixed resistances 224, 224' are equal to each other, and denoted as $R_{FB}$. In other examples the values of the resistances may be different. The value of each of the first switchable resistances 222,222' may be a value of $R_{FB}/(G1-1)$ where G1 is a gain factor which may be an integer value. The value of each of the first switchable resistances 232,232' may be a value of $R_{FB}/(G2-1)$ where G2 is a gain factor which may be an integer value smaller than G1 but greater than unity. The feedback switches 220,220', 230,230' have a control input connected by control line 204 to the controller 202. The class-D amplifier circuit 226, fixed resistances 224,224', switches 220, 230, 220', 230' and switchable resistances 222, 222', 232,232' may be considered a variable gain class-D amplifier 228.

In operation, the variable gain class-D amplifier 228 may be connected to a speaker (not shown). The variable gain class-D amplifier 228 may be connected to a power supply having a voltage $V_p$ which may vary depending on the power required by the variable gain class-D amplifier 228. The iDAC 216 may be supplied by a constant current reference $I_{DACREF}$ which has a value that may be determined from the maximum value of the supply voltage $V_p$. It will be appreciated that the other circuitry in the amplifier system 150 may be supplied at a voltage $V_p$ or a different, lower supply voltage dependent on the power requirements.

The amplifier system 200 operates in a similar way to the amplifier system 150, except in this case the amplifier system has three operating modes.

In a first operating mode, the supply voltage $V_p$ may be at a minimum value. The controller 202 may select the output of the first gain correction module 206 having a gain factor G1 as an input to the noise shaper 210 close the switches 220,220', and open the switches 230,230' which results in the effective feedback resistance of the variable gain class D amplifier 228 being reduced by a factor of G1 to $R_{FB}/G1$.

In a second operating mode, the supply voltage $V_p$ may be at an intermediate value. The controller 202 may select the output of the second gain correction module 206' having a gain factor G2 which may be an integer value smaller than G1 but greater than unity and close the switches 230,230' and open the switches 220,220' which results in the effective feedback resistance of the variable gain class D amplifier 228 being reduced by a factor of G2 to $R_{FB}/G2$.

In a third operating mode with the supply voltage $V_p$ at a maximum value, the controller 202 may select the audio input to be directly routed to the input of the noise shaper 210 by controlling the multiplexer 208 and switches 220, 220', 230, 230' may be open-circuit or off so that the effective feedback resistance is determined by the value of fixed resistances 224,224', that is to say $R_{FB}$.

The overall gain of the amplifier system 200 will remain the same following the transition between the three operation modes. By having a larger proportion of the overall gain in the digital domain at lower power supply values the overall noise in the amplifier system 200 may be reduced. At higher power supply values the noise may increase but since the high power operating mode may only be selected at larger input signal values, the overall signal to noise ratio of the audio amplifier system may still be the same. This may be further understood by considering a typical class D amplifying system illustrated in FIG. 4 and FIG. 5 which shows an equivalent circuit of a class D amplifier showing the noise sources.

Figure 4:
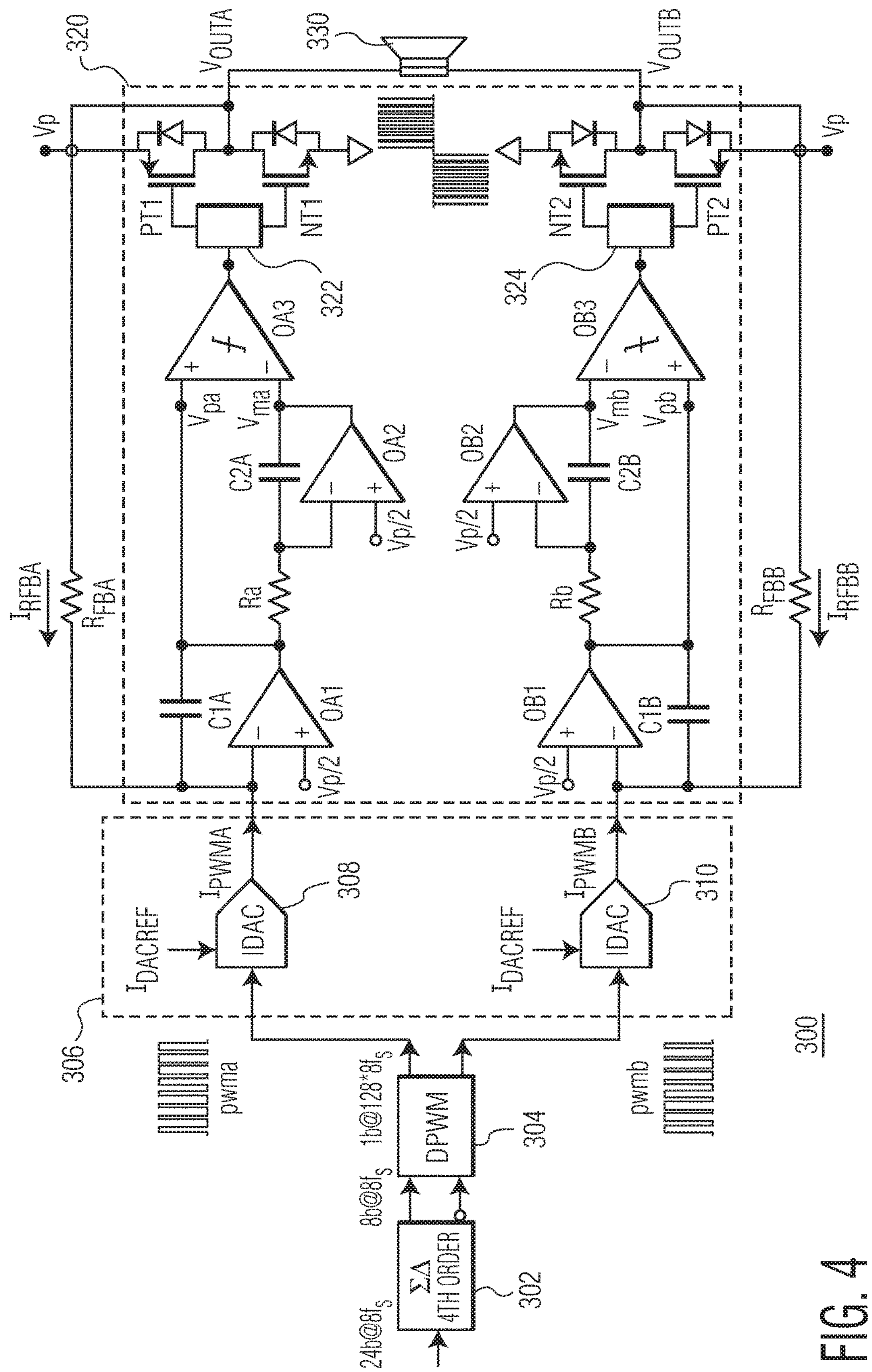
FIG. 4 shows a typical audio amplifier system including a class D amplifier.

Firstly with reference to the typical amplifier system of FIG. 4, a digital input signal which may for example be a 24-bit Pulse Code Modulated (PCM) signal oversampled 8×, and sampled at 8×48 kHz=384 kHz. This 8× oversampling ratio matches the desired pulse width modulated (PWM) carrier frequency. The digital input signal may be received by a fourth order sigma-delta modulator 302 which reduces this to an 8-bit PCM signal that is subsequently fed into a digital PWM-modulator 304. The digital PWM modulator (DPWM) then produces two 1-bit DPWM streams. The DPWM streams are then fed into an IDAC 306 including two current digital to analog converters 308,310 that transform the digital DPWM signals into bi-directional currents $I_{PWMA/B}$. These currents $I_{PWMA/B}$ have the same shape as the DPWM signal but switch between $\pm I_{DACREF}$ where $I_{DACREF}$ is a reference current.

The currents $I_{PWMA/B}$ are injected into the respective non-inverting inputs of the differential amplifiers OA1 and OB1 of the class-D amplifier circuit 320, which are virtual ground nodes in operation.

Class D amplifier circuit 320 includes differential amplifiers OA1, OA2, OA3. A capacitance C1A is connected between the output of OA1 and the inverting input of OA1. A series arrangement of a resistance RA and capacitance C2A is connected between the output of differential amplifier OA1 and the output of differential amplifier OA2. The common node between the resistance RA and the capacitance C2A is connected to the inverting input of the differential amplifier OA2. The output of OA2 is connected to the inverting input of OA3. The output of OA1 is connected to the non-inverting input of OA3. In operation a bias voltage of half the supply voltage $V_P/2$ is supplied to the non-inverting input of differential amplifiers OA1, OA2. The output of OA3 is connected to pre-driver 322 which drives an inverter INV1 including PMOS transistor PT1 and NMOS transistor NT1. The output of the MOS inverter is connected to the inverting input of OA1 via the feedback resistance $R_{FBA}$ and to a first terminal of the speaker 330.

Class-D amplifier circuit 320 further includes differential amplifiers OB1, OB2, OB3. A capacitance C1B is connected between the output of OB1 and the inverting input of OB1. A series arrangement of a resistance RB and capacitance C2B is connected between the output of differential amplifier OB1 and the output of differential amplifier OB2. The common node between the resistance RB and the capacitance C2B is connected to the inverting input of the differential amplifier OB2. The output of OB2 is connected to the inverting input of OB3. The output of OB1 is connected to the non-inverting input of OB3. In operation a bias voltage of half the supply voltage $V_P/2$ is supplied to the non-inverting input of differential amplifiers OB1, OB2. The output of OB3 is connected to pre-driver 324 which drives an inverter INV2 including PMOS transistor PT2 and NMOS transistor NT2. The output of the MOS inverter is connected to the inverting input of OV1 via the feedback resistance $R_{FBB}$ and to a second terminal of the speaker 330.

The gain of the class-D amplifier is determined by the two second-order analog feedback loops including the feedback path via resistances RFBA and $R_{FBB}$ that are biased at half the supply voltage $V_{P/}2$.

The output signals of the feedback loops are a BD-modulated differential PWM signal $V_{OUTA}-V_{OUTB}$ that drive the loudspeaker 330. The output voltages $V_{OUTA/B}$ are fed back through feedback resistors $R_{FBA/B}$ to the virtual ground nodes and the resulting feedback currents $I_{RFBA/B}$ are summed with the PWM input currents $I_{PWMA/B}$ coming from the IDAC's.

The stability of the analog feedback loops requires that the amplitude of the currents $I_{PWMA/B}$ injected into the loop by the IDAC's is larger than the currents $I_{RFBA/B}$ fed back through the feedback resistors $R_{FBA/B}$.

$$I_{DACREF} \cdot R_{FB} > \frac{V_P}{2} \quad (1)$$

The supply voltage $V_P$ of the amplifier may have a wide range of values, for example when the amplifier is supplied by a DC-DC booster. This maximum supply voltage may determine the IDAC reference current $I_{DACREF}$. Once $I_{DACREF}$ is set the (conversion) gain of the audio path is fixed and becomes independent of the supply voltage $V_P$.

Figure 5:
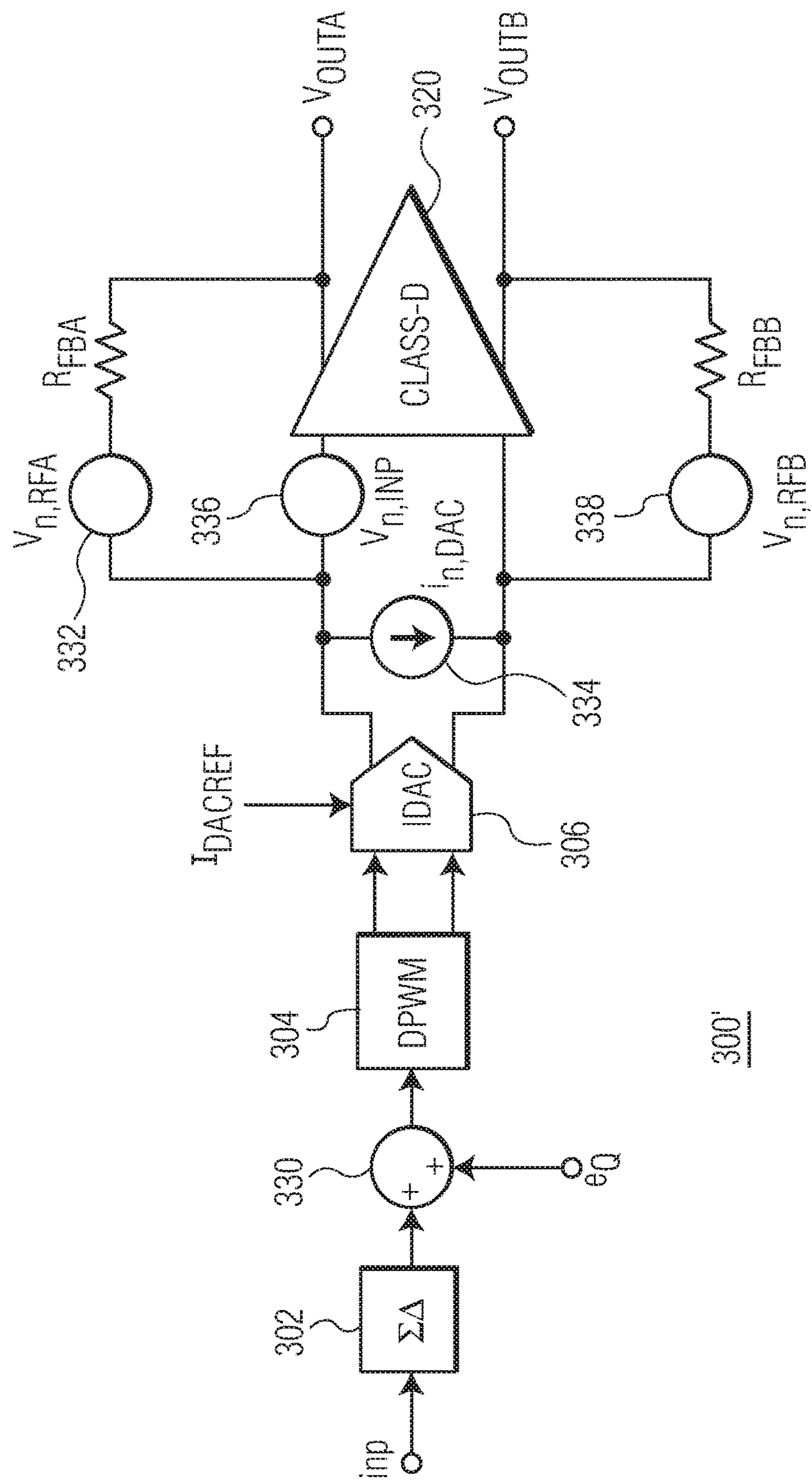
FIG. 5 shows an equivalent circuit for the amplifier of FIG. 4 showing possible noise sources.

A key performance metric for audio power amplifiers is the output noise voltage in the audio frequency range of 20 Hz to 20 KHz. FIG. 5 shows a typical amplifier 300' including the different noise contributors in the audio path. The amplifier 300' includes a series arrangement of sigma delta modulator 302, equalizer 330, DPWM module 304, IDAC 306 and class-D amplifier circuit 320 with a feedback resistance $R_{FBA}$ and $R_{FBB}$ from each of the respective differential outputs of the class-D amplifier circuit 320 to the respective differential input. The noise sources indicated are the IDAC noise circuit 334, the input noise voltage Vn 336 and the feedback noise voltage Vn, Rfb 332,338.

The sigma-delta modulator 302 at the input of the audio path reduces the 24-bit input signal to an 8-bit signal. This reduction in resolution can cause a significant level of quantization noise. This quantization noise is shaped out-of-band (i.e. out of the audio frequency range) by the loop filter in the sigma-delta modulator 302. The quantization noise that remains in the audio frequency range can be reduced by increasing the oversampling ratio or the order of the loop filter in the sigma-delta modulator. However, the oversampling ratio is limited to 8× by the PWM carrier frequency whereas increasing the loop filter order is only beneficial until the quantization noise contribution becomes insignificant with respect to the other (thermal and 1/f) noise contributions in the analog back end. The noise of the feedback resistors $R_{FB}$ and the equivalent input noise of the first stages of the analog feedback loop are shown as noise voltage sources vn,$R_{FB}$ 332,338 and $V_{n,INP}$ 336 respectively. These noise sources appear across the output without amplification. The noise produced by the IDAC is shown as a noise current source $i_{n,DAC}$ 334. This noise current is in principle proportional to the square root of reference current $I_{DACREF}$. This noise current is multiplied by the feedback resistors $R_{FBA/B}$ to produce a noise voltage at the output. In the typical class D amplifier design this last noise contribution may be the most dominant.

The current noise from the IDAC 334 may be reduced by reducing the value of the feedback resistors $R_{FBA/B}$ and reducing the IDAC reference current $I_{DACREF}$. However, this would violate equation (1) and lead to instability at high supply voltages.

The inventors of the present disclosure have realised that output noise is in general only relevant when no or a very small input signal is applied. Typically, noise measurements in DAC's and ADC's are done using a −60 dBFS input signal. An audio amplifier such as a smart speaker driver may use a DC-DC booster to increase the supply voltage of the audio amplifier in case a large signal needs to be amplified. Most of the time however, the DC-DC booster is in so-called follower mode where the converter is not switching but simply passes the battery voltage $V_{BAT}$ to output $V_{BST}$.

For the audio amplifier systems 150,200, the reference value of $I_{DACREF}$ is determined so that the stability criteria of equation 1 is met for the boosted supply voltage Vbst. At lower power supply voltages, the stability criterion of equation 1 can be relaxed. Consequently the output noise can be reduced by reducing the value of feedback resistors while maintain the current reference $I_{DACREF}$ without the risk of instability. Reducing the feedback resistors changes the gain of the audio path, so may be corrected in the digital front-end of the audio path which includes the variable gain digital audio processor. The gain reduction in the analog backend including the variable gain class D amplifier reduces not only the current noise from the IDAC but also the noise from the feedback resistors $R_{FB}$ and the quantization noise of the sigma-delta modulator. Hence the amplifier systems 150, 200 may allow for improved noise performance at lower levels of supply voltage.

Figure 6A:
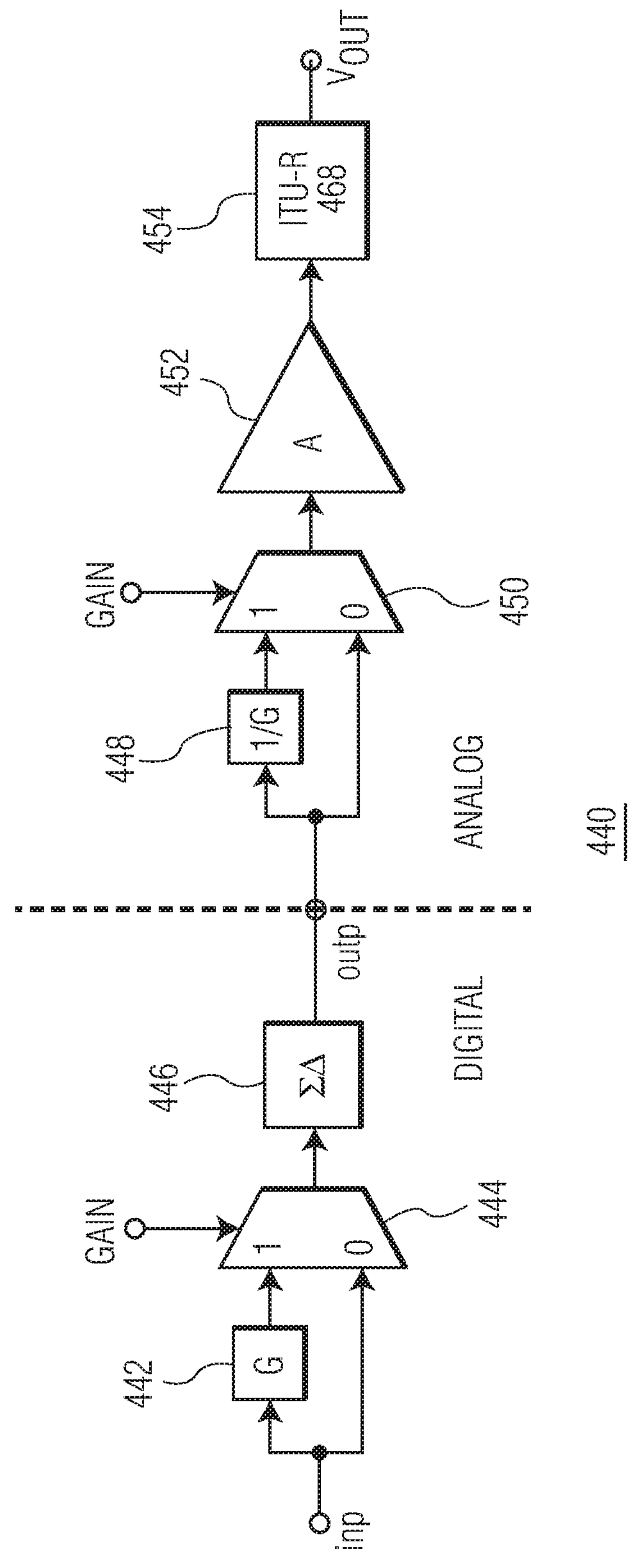
FIG. 6A illustrates an example arrangement of the gain correction in the digital and analog section of an audio amplifier system according to an embodiment.

FIG. 6A shows a simulation model of the audio path 440 of an example audio amplifier system. The digital gain corrector including a gain correction module 442 for applying a gain factor of G to an input signal and multiplexer 444 for selecting between the input signal with the gain factor applied and without the gain factor applied. The digital gain corrector may have an input connected to the digital audio input and an output connected to a sigma delta modulator 446. The analog portion includes an analog gain corrector including a gain correction module 448 for applying a gain factor of 1/G to an input signal and a multiplexer 450 having an input connected to the output of the sigma delta modulator 446, a second input connected to the gain correction module 448, and an output connected to an ideal gain stage 452. The output of the ideal gain stage 452 may be connected to an ITU-R 468 Filter 454. The behaviour of the audio path 440 is shown in FIGS. 6A and 6B for a gain factor G of 2.

Figure 6B:
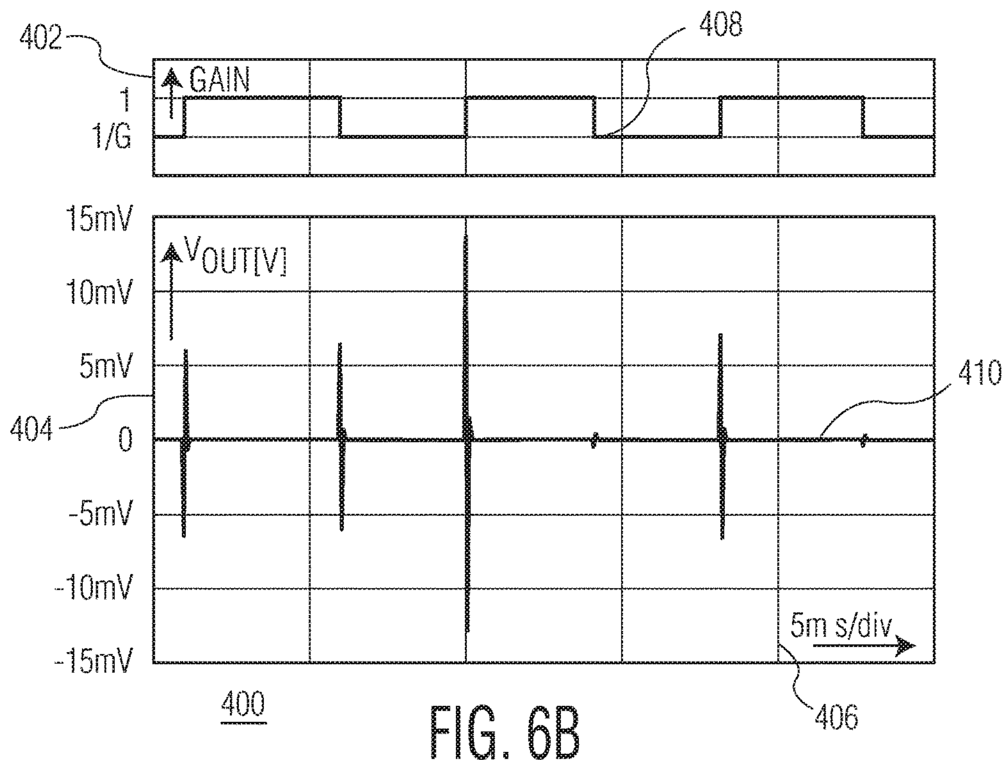
FIG. 6B shows a graph of the output noise voltage in different operation modes for the gain correction arrangement of FIG. 6A.

FIG. 6B shows a graph 400 of the response of the audio path 440 having a first y axis 402 showing the gain value in the analog back end A second y axis 404 shows the output noise voltage varying between −15 mV and +15 mv. The x axis 406 is time shown as 5 ms per division. Line 408 shows the gain switching waveform between an analog gain factor of 1 (high power operating mode) and 1/G (low power operating mode). Line 410 shows the noise voltage Vout at the output of the audio path 440.

Figure 6C:
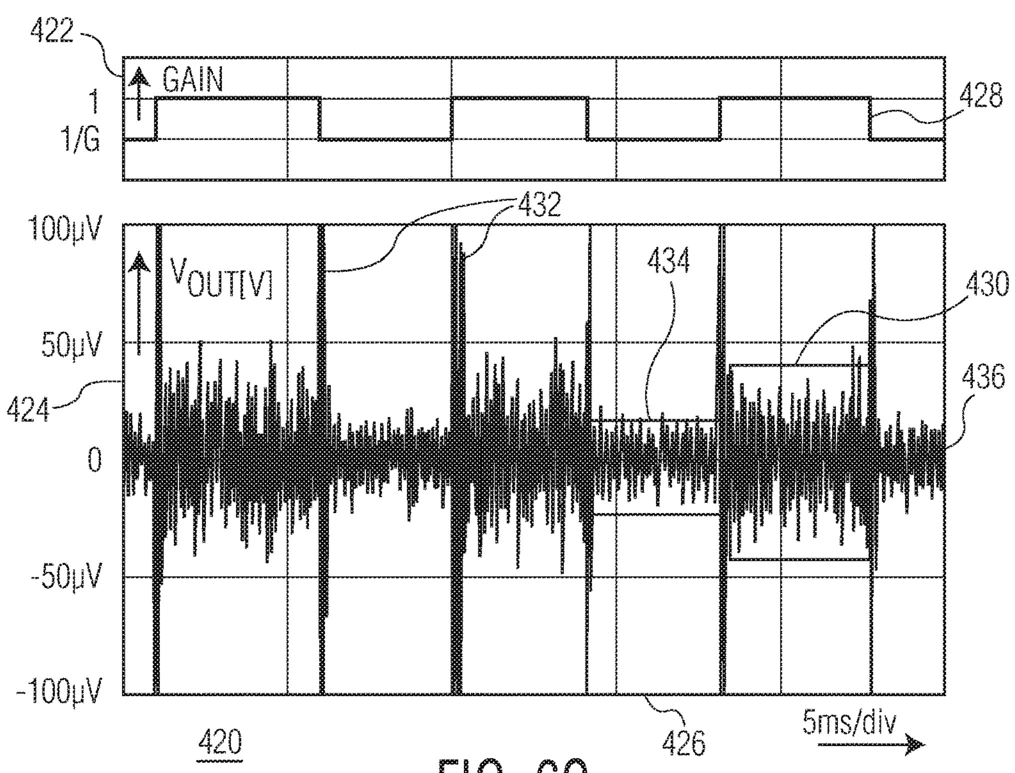
FIG. 6C shows a graph of further details output noise voltage in different operation modes for the gain correction arrangement of FIG. 6A.

FIG. 6C shows a graph 420 of the same response as FIG. 6B at larger scale to illustrate the quantization noise voltage. The first y axis 422 showing the showing the gain value in the analog back end and a second y axis 424 showing the output noise varying between −100 uV and +100 uv. The x axis 426 is time shown as 5 ms per division. Line 428 shows the gain switching waveform between an analog gain factor of 1 (high power operating mode) and 1/G (low power operating mode). Line 436 shows the voltage Vout at the output of the audio path 440. As can be seen, by correcting the gain in the digital domain before the sigma delta modulator the quantization noise in this case is approximately halved in region 434 compared to region 430. Some transient artefacts 432 occur during switching which may be >10 mV.

Figure 7A:
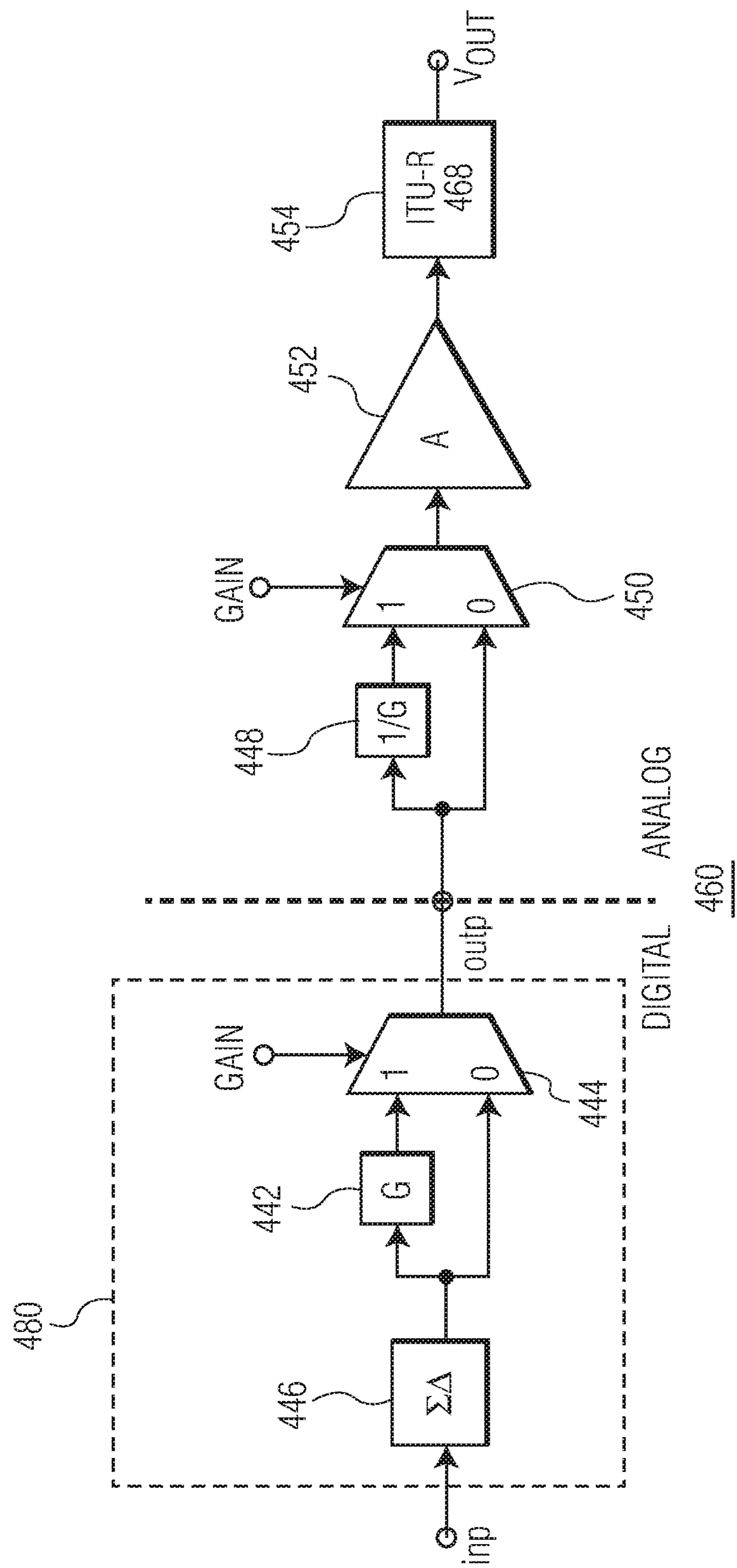
FIG. 7A illustrates an example arrangement of the gain correction in the digital and analog section of an audio amplifier system according to an embodiment.
Figure 7B:
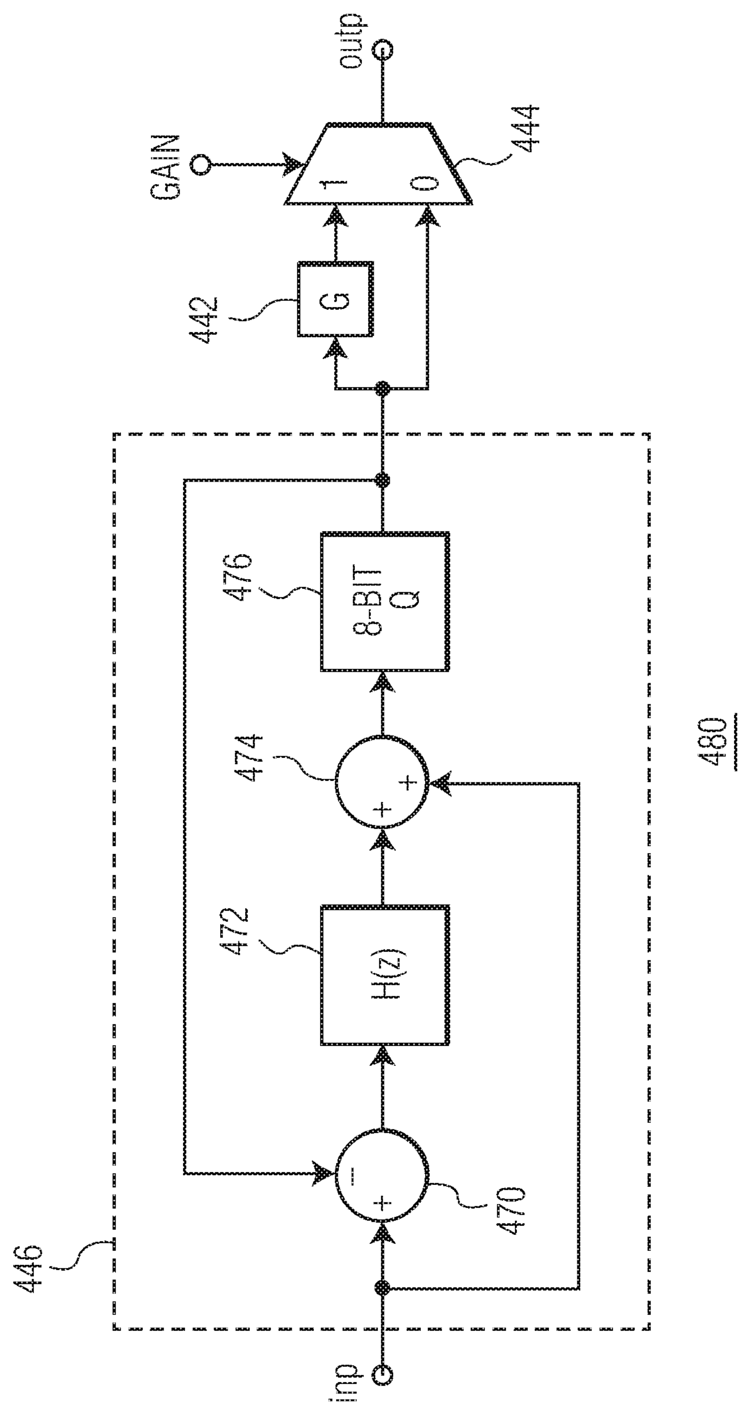
FIG. 7B shows a sigma delta modulator noise shaper and gain corrector according to an embodiment.
Figure 7C:
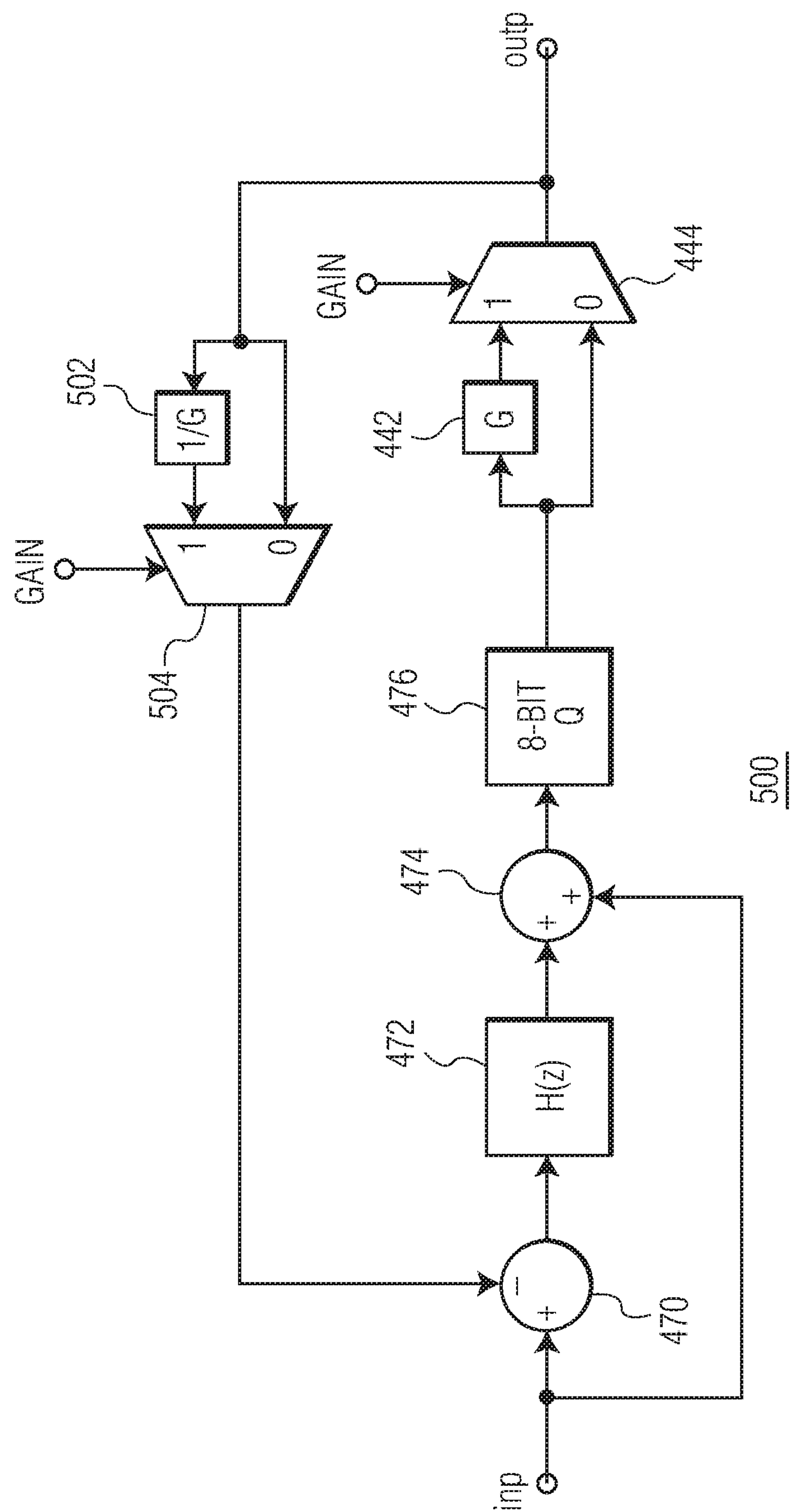
FIG. 7C shows a sigma delta modulator noise shaper incorporating a gain corrector according to an embodiment.

An alternative arrangement of the gain correction in the digital front end of embodiments of the audio amplifier system is shown in FIGS. 7A, 7B, and 7C.

FIG. 7A shows a simulation model of the audio path 460 of an example audio amplifier system. A variable gain digital audio processor 480 may include a gain correction module 442, a multiplexer 444 and a sigma delta modulator 446. The sigma delta modulator 446 may have an input connected to the digital audio input. The output of the sigma delta modulator 446 may be connected to the digital gain corrector including gain correction module 442 and multiplexer 444. The analog portion includes a gain correction module 448 and a multiplexer 450 having an input connected to the output of the multiplexer 444 via a DAC (not shown) and an output connected to an ideal gain stage 452. The output of the ideal gain stage 452 may be connected to an ITU-R 468 Filter 454.

FIG. 7B shows an example implementation of the variable gain digital audio processor 480. The sigma delta modulator 446 which has a series arrangement of an adder/subtractor 470, a loop filter 472 and equalizer 474 and a quantizer 476 which may for example be an 8 bit quantizer. The sigma delta modulator 446 has a feedback connection from the output of the quantizer 476 to a first input of the adder/subtractor 470. The sigma delta modulator may have a feed-forward connection from the second input of the adder/subtractor 470 to the equalizer 474. The output of the sigma delta modulator 446 may be connected to the digital gain corrector including gain correction module 442 for applying a gain factor G and multiplexer 444 for selecting between the gain corrected signal and the uncorrected signal.

FIG. 7C shows an alternative implementation of a sigma delta modulator 500 which incorporates a gain corrector. The sigma delta modulator 500 has an equivalent function to variable gain digital audio processor 480. The sigma delta modulator 500 has a series arrangement of an adder/subtractor 470, a loop filter 472 and equalizer 474, a quantizer 476 which may for example be an 8 bit quantizer and digital gain corrector including gain correction module 442 for applying a gain factor G and multiplexer 444. The sigma delta modulator 500 has a feedback connection from the output of the digital gain corrector to a second digital gain corrector including gain correction module 502 for applying a gain factor 1/G and multiplexer 504. The second digital gain corrector applies an inverse gain correction factor 1/G in the feedback path when the digital gain corrector applies a gain factor G. The output of second digital gain corrector is connected to the first input of the adder/subtractor 470. The sigma delta modulator may have a feed-forward connection from the second input of the adder/subtractor 470 to the equalizer 474.

Figure 7D:
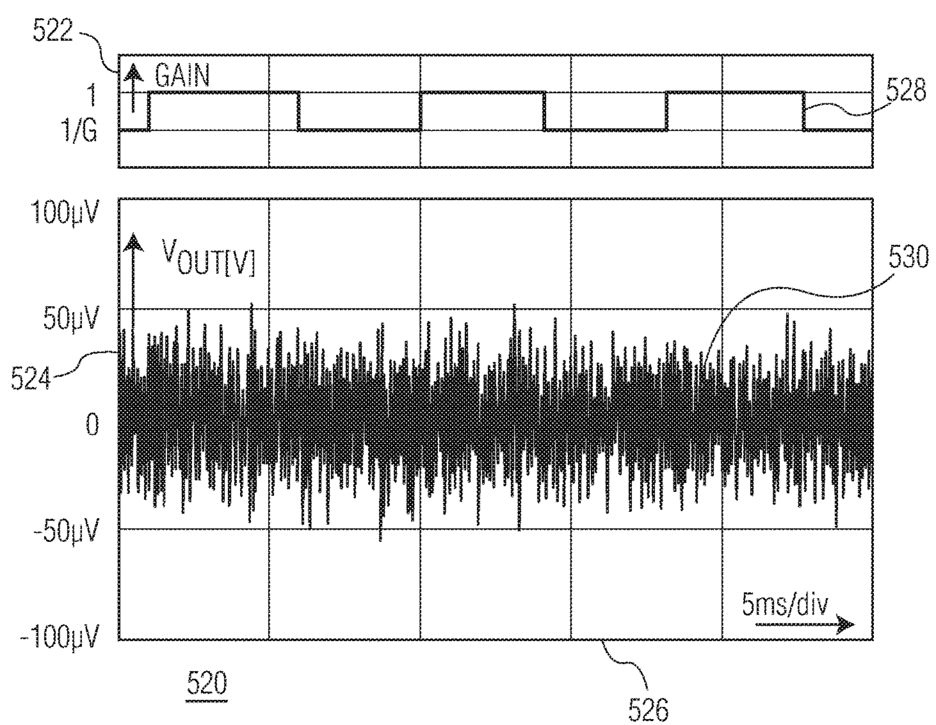
FIG. 7D shows a graph of the output noise voltage when switching gain values for the example gain arrangement of FIG. 7A.

The noise voltage response of the audio path 460 is illustrated in FIG. 7D which has a graph of simulation results 520 of output noise voltage in the different modes. The graph 520 has a first y axis 522 showing the gain switching in the audio path 460 and a second y axis 524 showing the output noise varying between −100 uV and +100 uv. The x axis 526 is time shown as 5 ms per division. Line 528 shows the gain switching waveform between an analog gain factor of 1 (high power operating mode) and 1/G (low power operating mode). Line 530 shows the voltage Vout at the output of the audio paths. In this case there are no transients during switching but the quantization noise remains constant in both modes.

Figure 8A:
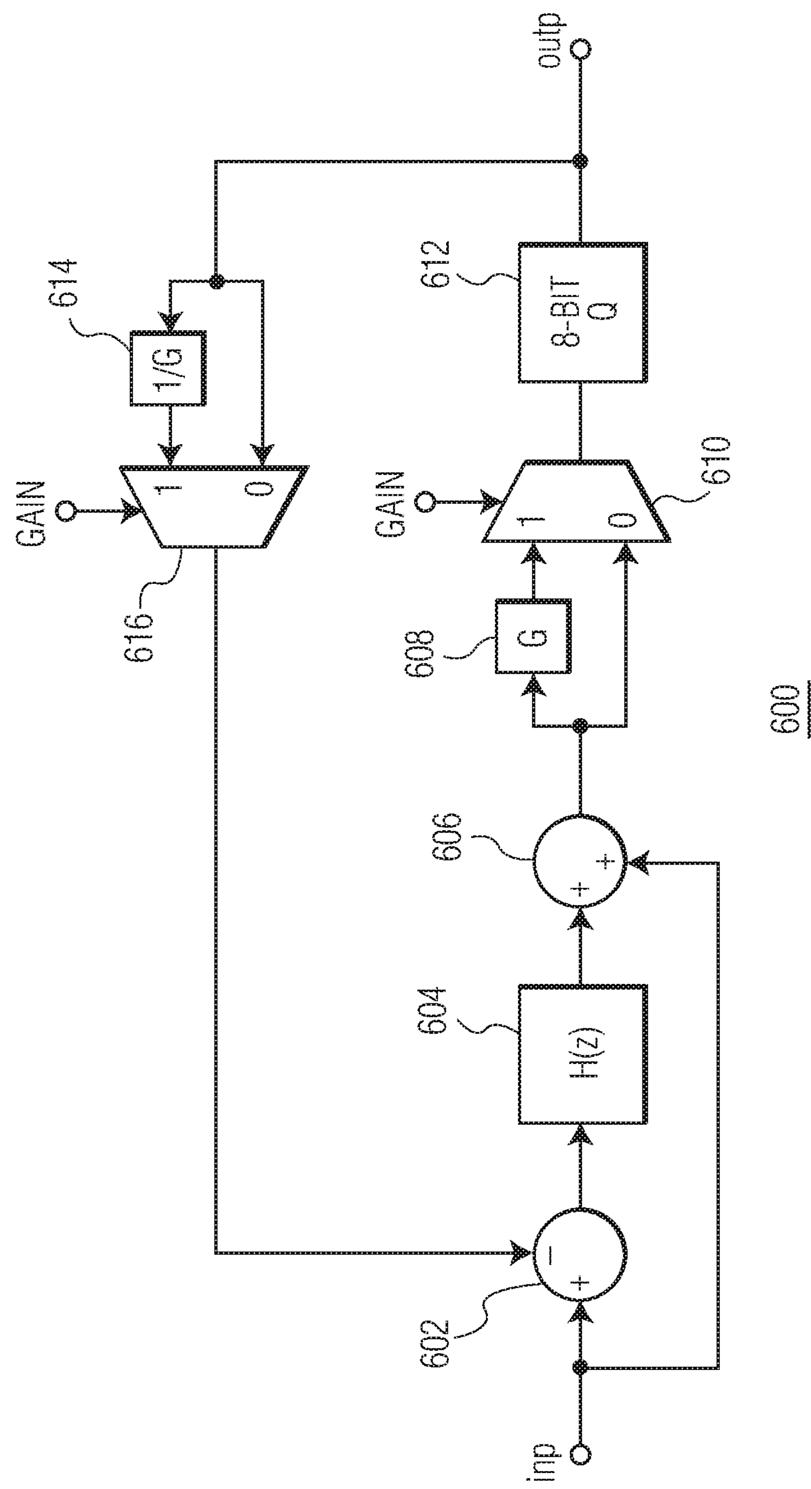
FIG. 8A shows a noise shaper incorporating a gain corrector included in one or more embodiments of the audio amplifier system.

FIG. 8A shows a further alternative implementation of a sigma delta modulator 600. The sigma delta modulator 600 has a series arrangement of an adder/subtractor 602, a loop filter 604, equalizer 606, a digital gain corrector which may include a gain correction module 608 for applying a gain factor G and multiplexer 610, and a quantizer 612 which may for example be an 8 bit quantizer. The sigma delta modulator 600 has a feedback connection from the output of the quantizer 612 to a second digital gain corrector including gain correction module 614 for applying a gain factor 1/G and multiplexer 616. The second digital gain corrector applies an inverse gain correction factor 1/G in the feedback path when the digital gain corrector applies a gain factor G. The output of second digital gain corrector is connected to the first input of the adder/subtractor 602. The sigma delta modulator may have a feed-forward connection from the second input of the adder/subtractor 602 to the equalizer 606.

Figure 8B:
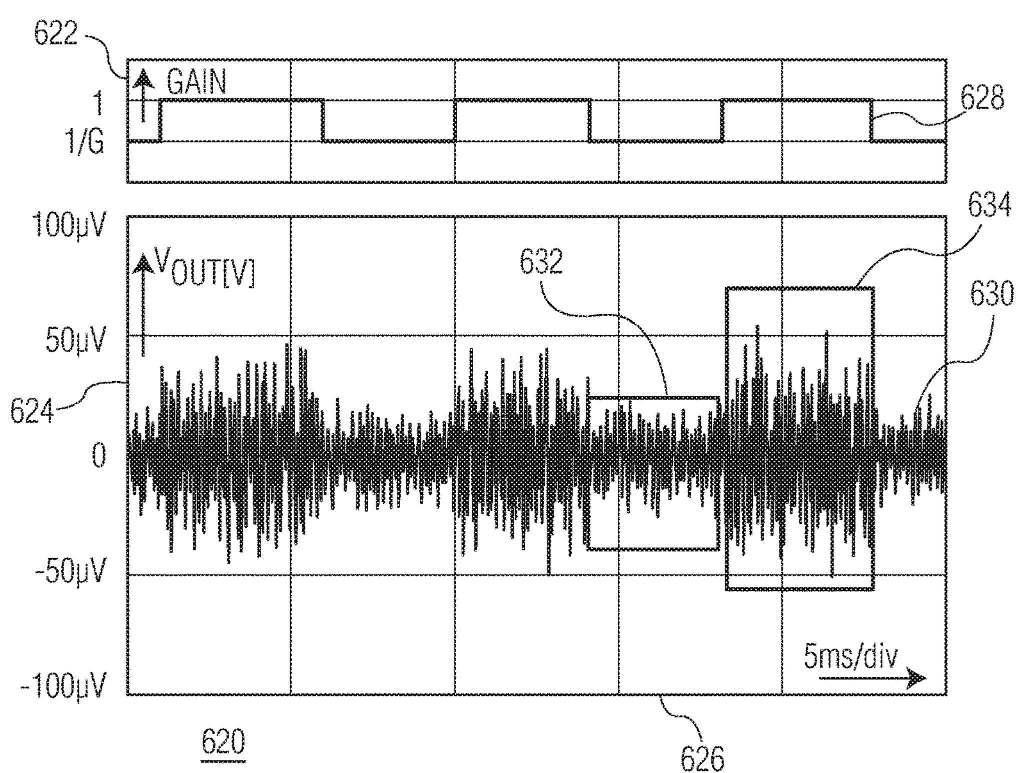
FIG. 8B shows a graph of the output voltage when switching gain values in some embodiments including the noise shaper of FIG. 8A.

The behaviour of an audio amplifier system having a variable gain digital audio processor including the sigma delta modulator 600 is illustrated in FIG. 8B. FIG. 8B shows a graph 620 of an output noise voltage in the different operational modes using a gain factor G of 2. The graph 620 has a first y axis 622 showing the gain switching and a second y axis 624 showing the output noise varying between −100 uV and +100 uv. The x axis 626 is time shown as 5 ms per division. Line 628 shows the gain switching waveform between an analog gain factor of 1 (high power operating mode) and 1/G (low power operating mode). Line 630 shows the voltage Vout at the output of the audio paths. In this case there are no transients during switching between modes and the quantization noise is approximately halved in region 632 corresponding to the low power operating mode compared to region 634 corresponding to the high power operating mode.

Figure 8C:
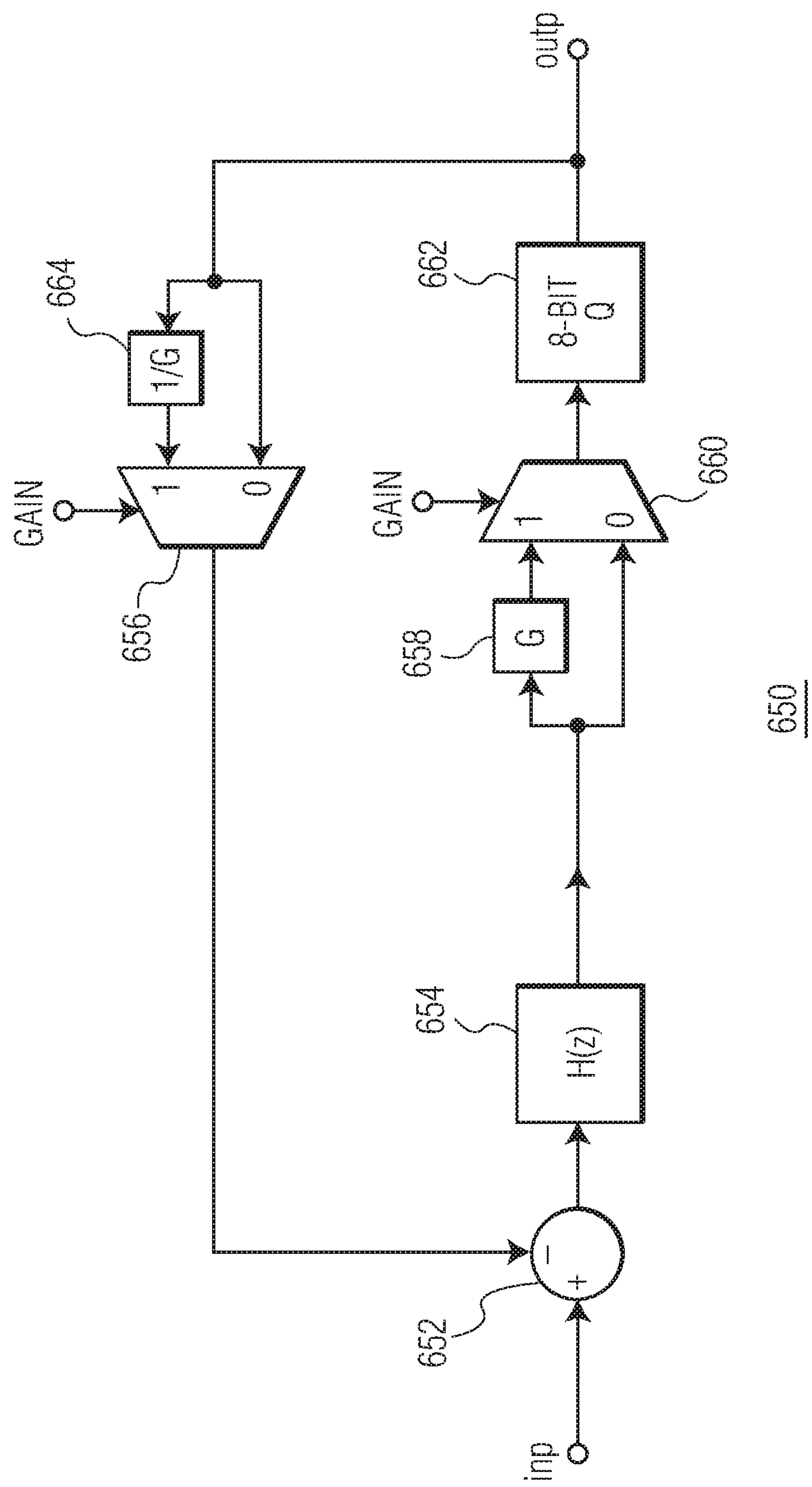
FIG. 8C shows a noise shaper incorporating a gain corrector included in one or more embodiments of the audio amplifier system.

FIG. 8C shows a further alternative implementation of a sigma delta modulator 650 which. The sigma delta modulator 650 has a series arrangement of an adder/subtractor 652, a loop filter 654, digital gain corrector including gain correction module 658 for applying a gain factor G and multiplexer 660, and a quantizer 662 which may for example be an 8 bit quantizer. The sigma delta modulator 650 has a feedback connection from the output of the quantizer 662 to a second digital gain corrector including gain correction module 664 for applying a gain factor 1/G and multiplexer 656. The second digital gain corrector applies an inverse gain correction factor 1/G in the feedback path when the digital gain corrector applies a gain factor G. The output of second digital gain corrector is connected to the first input of the adder/subtractor 652. The sigma delta modulator 650 may have similar improved quantization noise performance and transient switching to sigma delta modulator 600.

By moving the gain correction before the quantizer as shown in FIGS. 8A and 8C, the loop transfer remains unchanged when the gain correction is enabled or disabled but now the quantization noise also remains unchanged in both modes and is not multiplied by gain factor G anymore. Consequently, the contribution of the quantization noise to the output noise of the audio path is divided by G when the analog gain change is simultaneously enabled.

Further alternative implementations of the sigma delta modulator may shift the location of the gain correction towards the input of the loop. In general, the loop filter H(z) is constructed with adders, multipliers and delay elements. The gain correction block may be shifted towards the input of any linear time-invariant (LTI) element, e.g. adders, gains or branches as illustrated. It will be appreciated that the transfer functions of these equivalent topologies are identical.

Figure 9A:
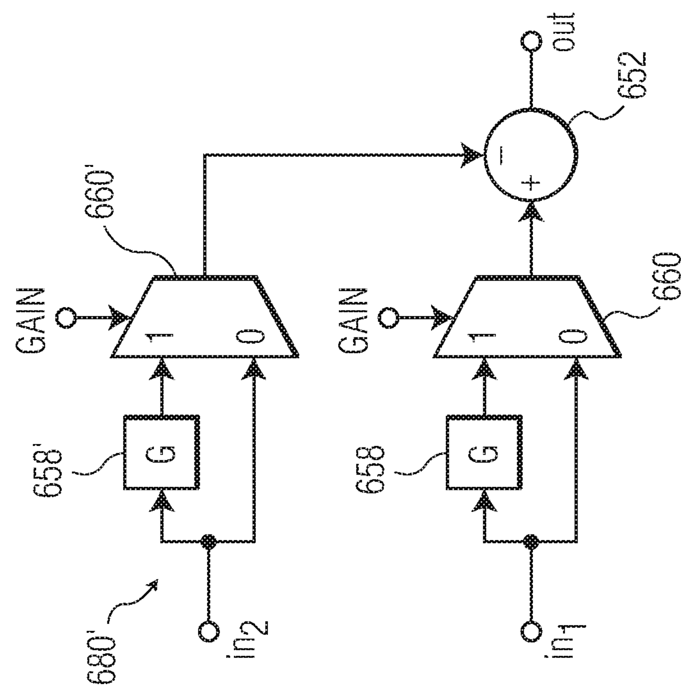
FIGS. 9A, 9B and 9C illustrate alternative arrangements of gain correctors and linear time invariant elements in the noise shaper included in one or more embodiments of the audio amplifier system.
Figure 9A:
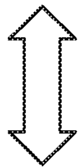
Figure 9A:
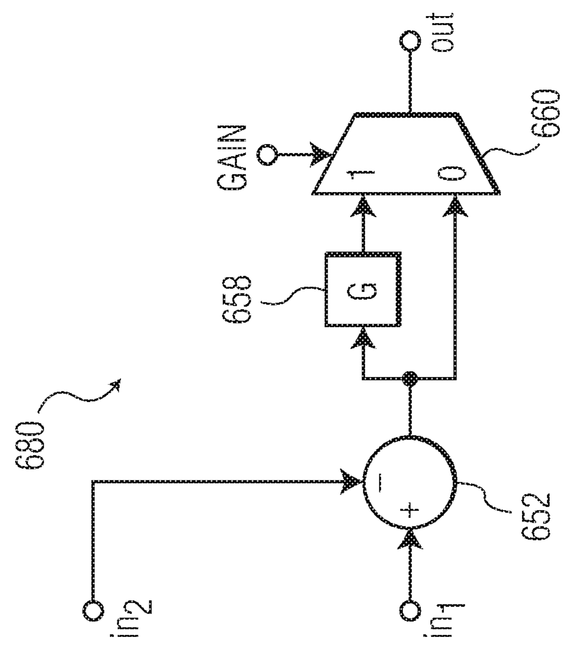

FIG. 9A shows a first example LTI element 680 including an adder 652, with gain correction module 658 and multiplexer 660 at the output of the adder 652, and a second equivalent LTI element 680' including an adder 652, gain correction modules 658,658' and multiplexers 660,660' in the signal path before the adder 652.

Figure 9B:
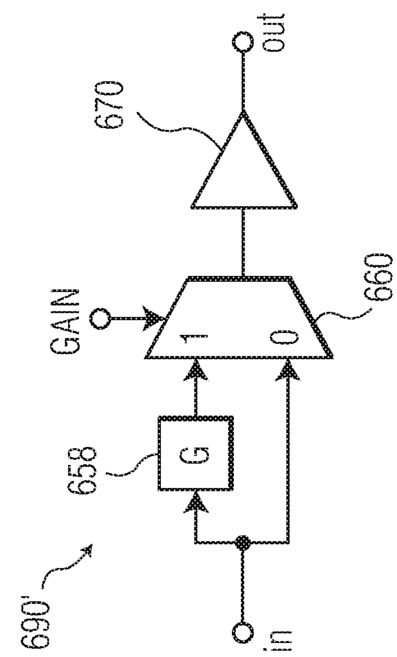
Figure 9B:
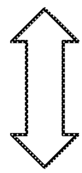
Figure 9B:
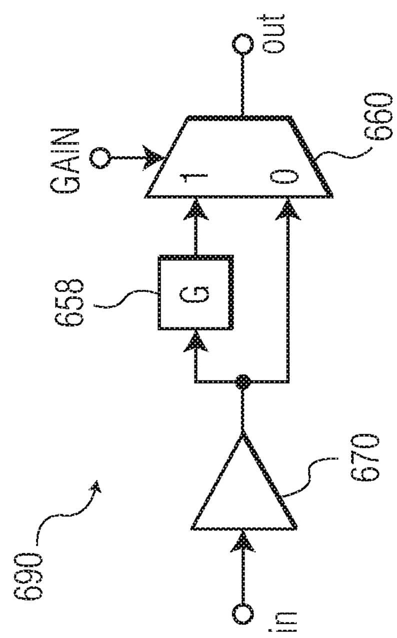

FIG. 9B shows a first example LTI element 690 including a gain element 670, with gain correction module 658 and multiplexer 660 at the output of the gain element 670, and a second equivalent LTI element 690' including gain element 670, gain correction module 658, and multiplexer 660 in the signal path before the gain element 670.

Figure 9C:
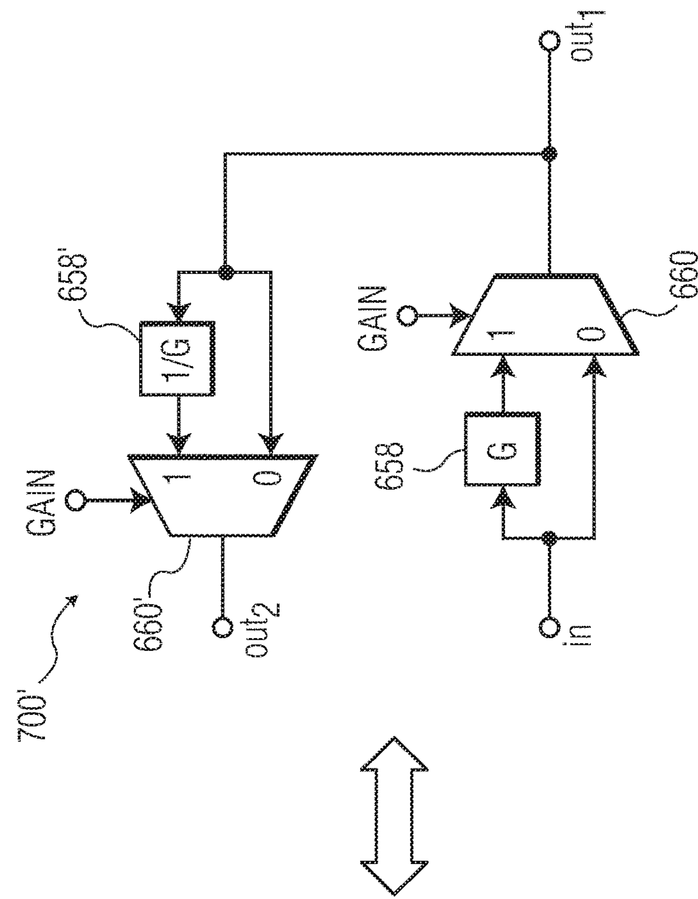
Figure 9C:
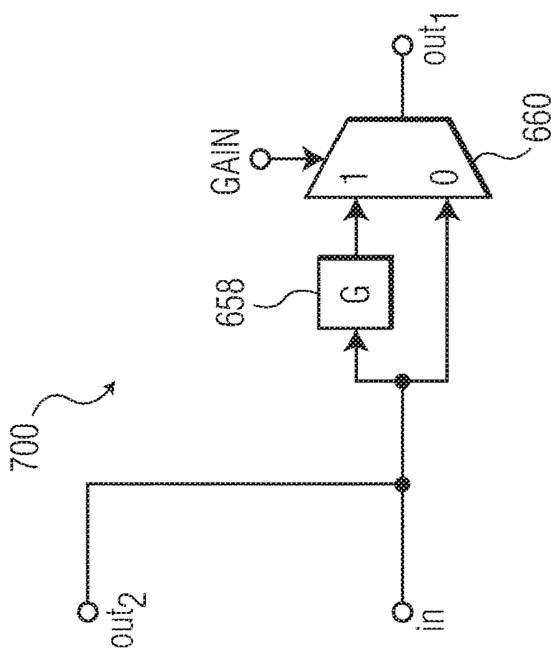

FIG. 9C shows a first example LTI element 700 including a branch from one input to two outputs including a gain correction module 658 and multiplexer 660 after the branch and a second equivalent LTI element 700' including gain correction module 658, and multiplexer 660 before the branch and gain correction module 658', and multiplexer 660' after the branch.

Figure 10A:
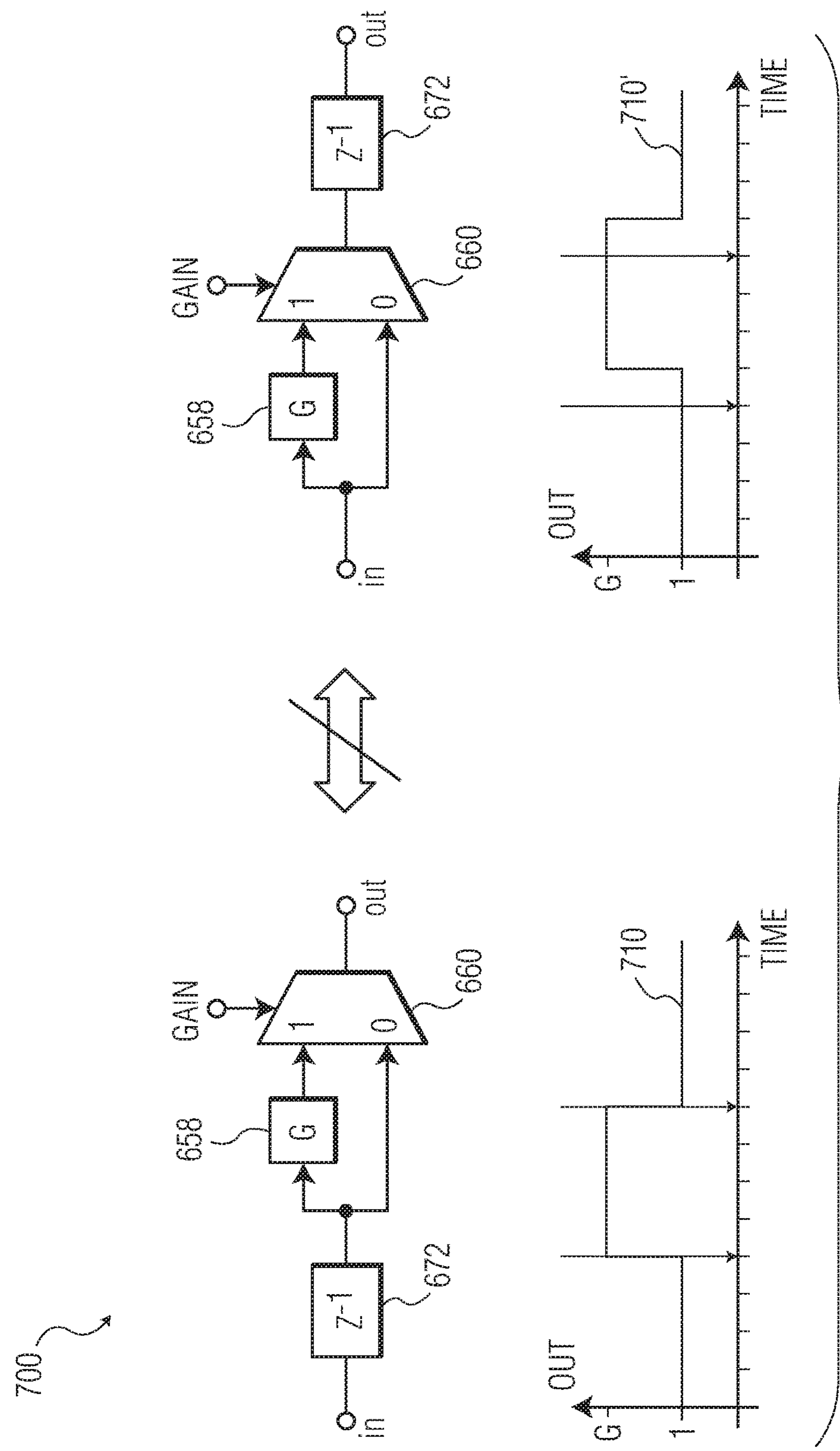
FIG. 10A illustrates the effect of introducing a delay in the gain switching.

Referring now to FIG. 10A, for non-LTI elements for example sequential delay elements 672 such as latches or flip-flops, the gain correction cannot be simply shifted through the element since the behaviour is different depending on whether the gain correction performed by gain correction module 658 and multiplexer 660 is before or after the delay element 672. The graphs 710,710' illustrate the output of both topologies when the gain is switched back and forth while a unity input signal is applied. In the graph 710' the effect of gain switching is delayed by one clock cycle.

Figure 10B:
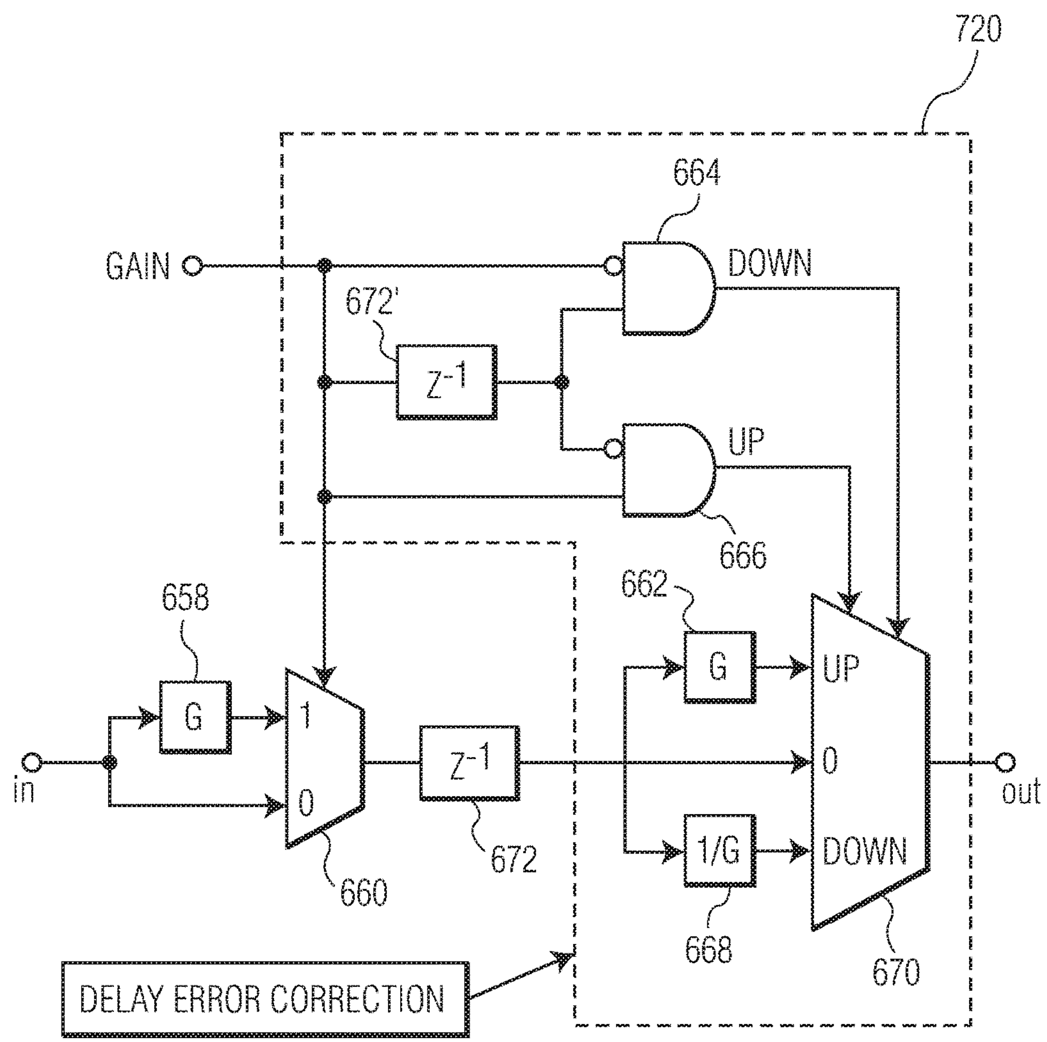
FIG. 10B shows a delay error correction included in one or more embodiments of the audio amplifier system.
Figure 10C:
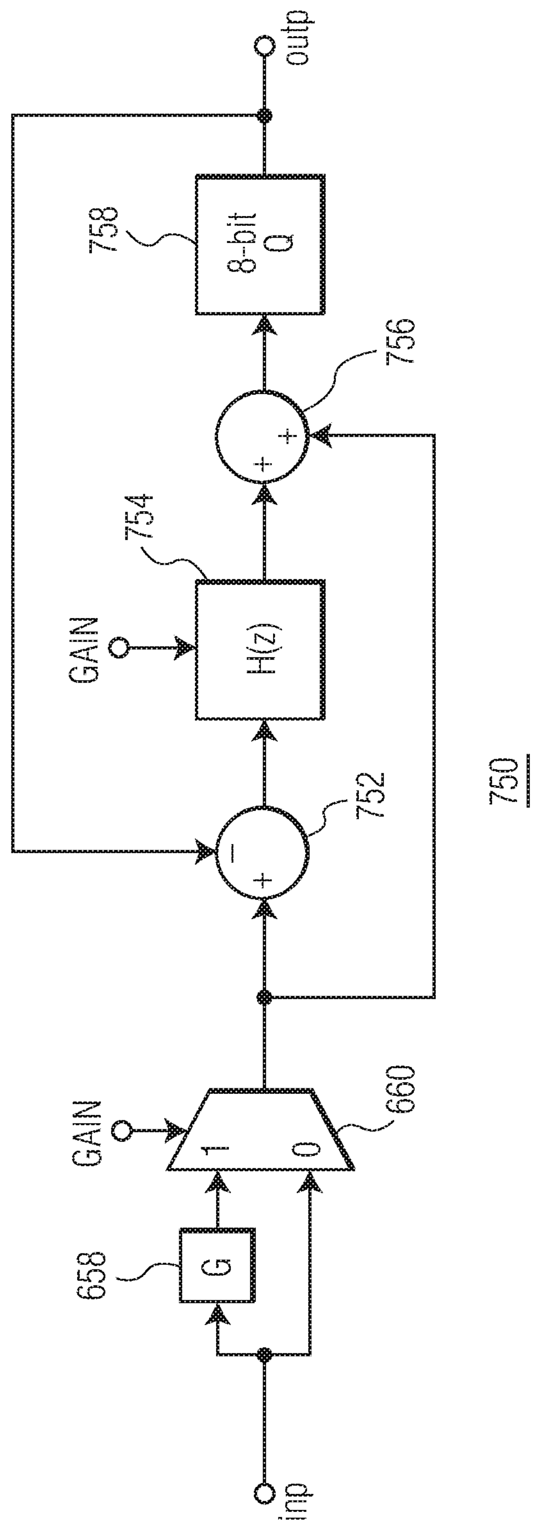
FIG. 10C shows a noise shaper including the delay error corrector of FIG. 10B.

This error can be corrected by including a delay error corrector 720 shown in FIG. 10B. The gain error corrector 720 includes a gain control line connected to an inverting input of an AND gate 664 and a non-inverting input of a second AND gate 666. A delay element 672' has an input connected to the gain control line and an output connected to the non-inverting input of an AND gate 664 and an inverting input of a second AND gate 666. The outputs of the AND gates 664,666 are connected to control inputs of a multiplexer 670 which selects between an output of a gain correction module 662 which applies a gain factor G to an input signal, a gain correction module 668 which applies a gain factor 1/G to an input signal and an input signal. In operation, the delay error corrector multiplies the output of the delay element for only one clock cycle following a gain transition. The up and down signals are high for one clock cycle following a low-to-high or high-to-low transition of the gain signal. Consequently the gain correction can be shifted all the way to the input of the sigma delta modulator 750 shown in FIG. 10C.

The sigma delta modulator 750 has a series arrangement of an digital gain corrector including gain correction module 658 for applying a gain factor G and multiplexer 660, an adder/subtractor 752, a loop filter 754, an equalizer 756, and a quantizer 758 which may for example be an 8 bit quantizer. The sigma delta modulator 750 has a feedback connection from the output of the quantizer 758 to an input of the adder/subtractor 752. A second input of the adder subtractor 752 has a feed-forward connection to the equalizer 756. The loop filter 754 has a gain control input. The delay corrector 720 may be included after each delay element in the loop filter 754.

It will be appreciated that any of sigma delta modulators 500, 600, 650, 750 may be included in a variable gain digital audio processor for embodiments of the audio amplifier system herein described.

Figure 11:
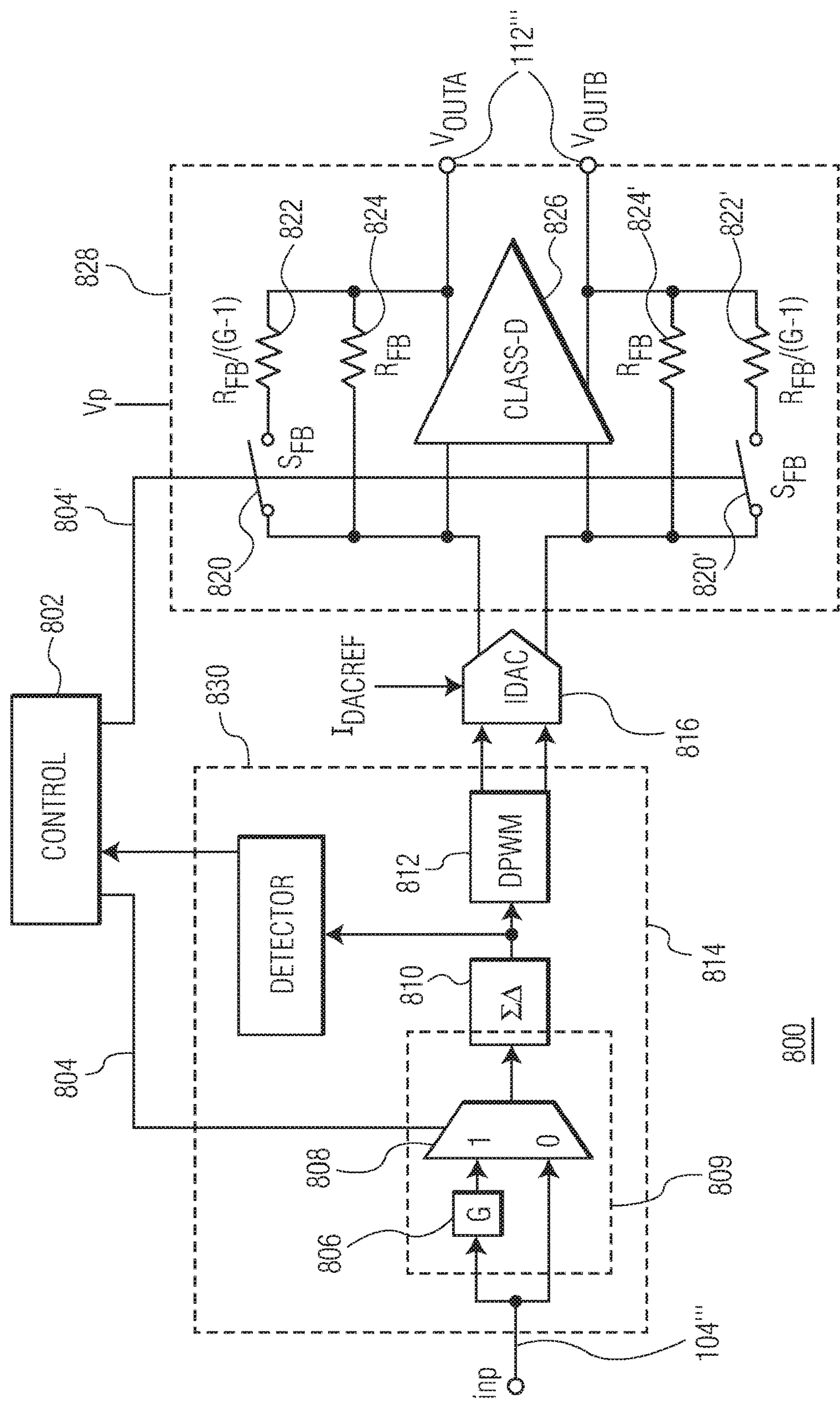
FIG. 11 shows an audio amplifier system according to an embodiment.

FIG. 11 shows an audio amplifier system 800. A variable gain digital audio processor 814 may include a gain correction module 806 having an input coupled to the digital audio input 104''' and an output connected to a first input of a multiplexer 808. The digital audio input 104''' may be connected to a second input of the multiplexer 808. A control input of the multiplexer 808 may be connected by control line 804 to a controller 802. The gain correction module 806 and the multiplexer 808 may be considered to be a digital gain corrector 809. The gain correction module may apply a gain factor denoted G to the input signal. The gain correction module 806 may for example multiply the incoming digital audio signal with an integer value. In cases where the gain factor is a power of two, the gain correction module 806 may be implemented by a shift operation of the digital audio data. The variable gain digital audio processor 814 may include a series arrangement of a noise shaper 810 which may be a sigma delta modulator, and a pulse width modulation generator 812. The input of the noise shaper 810 may be connected to the output of the multiplexer 808. The output of the noise shaper 810 may be connected to detector 830. The output of the detector 830 may be connected to the controller 802. The digital pulse width modulator 812 may have a differential pair of outputs coupled to a current-mode DAC (iDAC) 816. The current-mode digital to analog converter may have a pair of differential outputs connected to a class-D amplifier circuit 826 having a pair of differential inputs and a pair of differential outputs connected to audio output terminals 112'''0. The audio output terminals 112''' may be connected to drive a speaker or loudspeaker (not shown). A feedback path between each respective differential output and differential input has an arrangement of a fixed resistances 824,824' in parallel with a series arrangement of a feedback switch 820,820' and resistances 822,822'. The resistances 822,822' may be referred to as switchable resistances. The series arrangement of the respective switches 820,820' and switchable resistances 822,822' may be considered as a switchable resistor. The feedback switches 820,820' have a control input connected by control line 804' to the controller 802. It will be appreciated that for example the switches 820,820' may be implemented as transistors such as MOS or bipolar transistors. The value of each of the fixed resistances 824,824' may be equal to each other, and denoted as $R_{FB}$. The value of each of the switchable resistances 822,822' may be a value of $R_{FB}/(G-1)$ where G is the value of a gain factor which may be an integer value. The class-D amplifier circuit 826, fixed resistances, switches 820, 820' and switchable resistances 822, 822' may be a variable gain class-D amplifier 828.

In operation, the variable gain class-D amplifier 828 may be connected to a speaker (not shown). The variable gain class-D amplifier 828 may be connected to a power supply having a voltage $V_p$ which may vary depending on the power required by the variable gain class-D amplifier 828. The iDAC 816 may be supplied by a constant current reference $I_{DACREF}$ which has a value that may be determined from the maximum value of the supply voltage $V_p$. It will be appreciated that the other circuitry in the amplifier system 800 may be supplied at a voltage $V_p$ or a different, lower supply voltage dependent on the power requirements.

In a first operation mode, which may be termed a low power operation mode, the voltage $V_p$ may be at first level which may for example be the voltage from a battery power source. In this first low power operation mode, the controller 802 may control the gain corrector 809 to connect the input of the noise shaper 810 to the output of the gain correction module 806 which applies a gain factor G to the digital audio input signal. The controller 802 may close the respective switches 820,820' the switchable resistances 822,822' by controlling the respective switches 820,820'. In this case the effective feedback resistance value is that of the fixed resistances 824, 824' ($R_{FB}$) in parallel with that of the respective switchable resistors 822,822' ($R_{FB}/(G-1)$) that is to say an effective value of $R_{FB}/G$. Since the gain of the class-D amplifier is linearly dependent on the resistance value, the gain of the variable gain class-D amplifier 828 decreases by a factor of G.

In a second operation mode, which may be termed a high power operation mode, the voltage $V_p$ may be at a second higher level which may for example be a boosted supply voltage from a battery power source. The supply voltage may be boosted by a DC boost converter (not shown). In this second high power operation mode, the controller 802 may control the gain corrector 809 to connect the input of the noise shaper 810 directly to the digital audio input. Consequently the gain applied at this stage is reduced by a factor of G compared to the first low power operation mode. The controller 802 may open circuit the switchable resistances 822,822' by controlling the respective switches 820,820'. In this case the effective feedback resistance value is that of the fixed resistances 824, 824', that is to say $R_{FB}$ which is a gain increase of a factor G compared with the first operation mode. Consequently the overall gain of the amplifier system 800 remains the same as the first low power operation mode.

By having a larger proportion of the overall gain in the digital domain, that is to say the digital front-end or digital portion of the audio path, at lower power supply values the overall noise in the amplifier system 800 may be reduced. At higher power supply values the noise may increase but since the high power operating mode may only be selected at larger input signal values, the overall signal to noise ratio of the audio amplifier system may still be the same.

The detector 830 may detect zero values output from the sigma delay modulator 810. The controller 802 may delay switching between the first operation mode and the second operation mode or vice versa until a predetermined number of consecutive zero values have been detected. By delaying switching between operation modes until a number of zero values have been detected, any noise due to transient switching may be further reduced. This is further shown in FIGS. 12A to 12E.

Figure 12A:
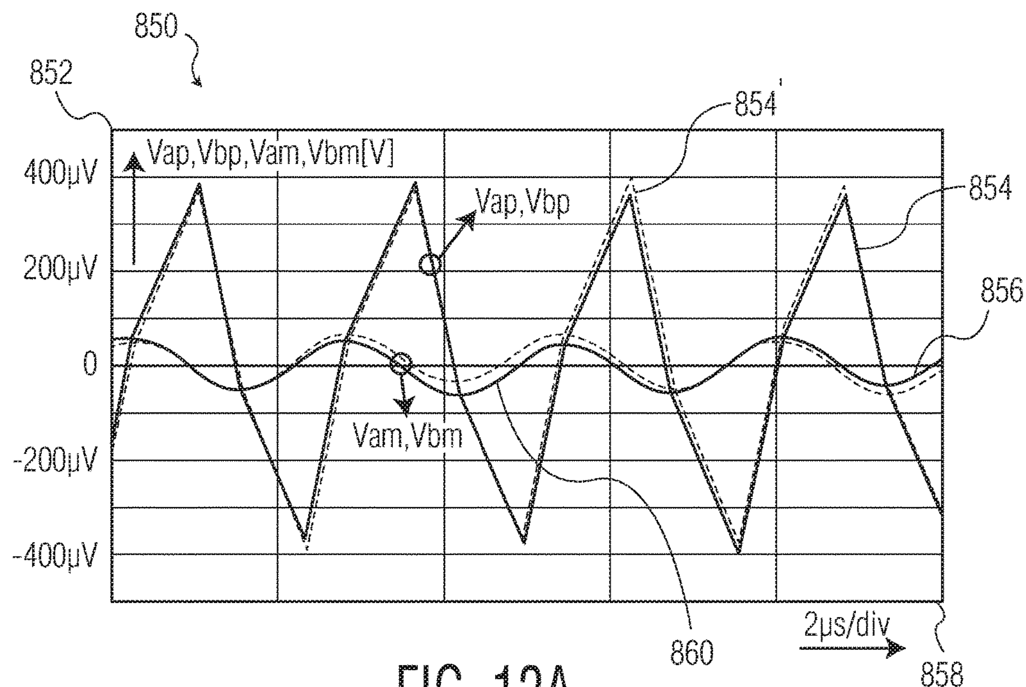
FIG. 12A shows integrator outputs of an analog feedback loop of a class-D amplifier and included in the audio amplifier system of FIG. 4 when quantization noise is injected.

FIG. 12A shows a graph 850 of the response of the integrator outputs OA1, OB1, OA2, OB2 of the typical analog class D feedback loop 320. The y-axis 852 is the voltage between −400 mV and +400 mV. The x-axis 858 is time shown as 2 us per division. Lines 854,854' show the input waveforms on the non-inverting inputs of OA3 and OB3 in case quantization noise is injected into the analog class-D feedback loop 320. Line 856 shows the response of OA2 and line 860 shows the response of OB2. As can be seen the signals are similar but most of the time the values are different which results in differences in the transient response when gain switching.

Figure 12B:
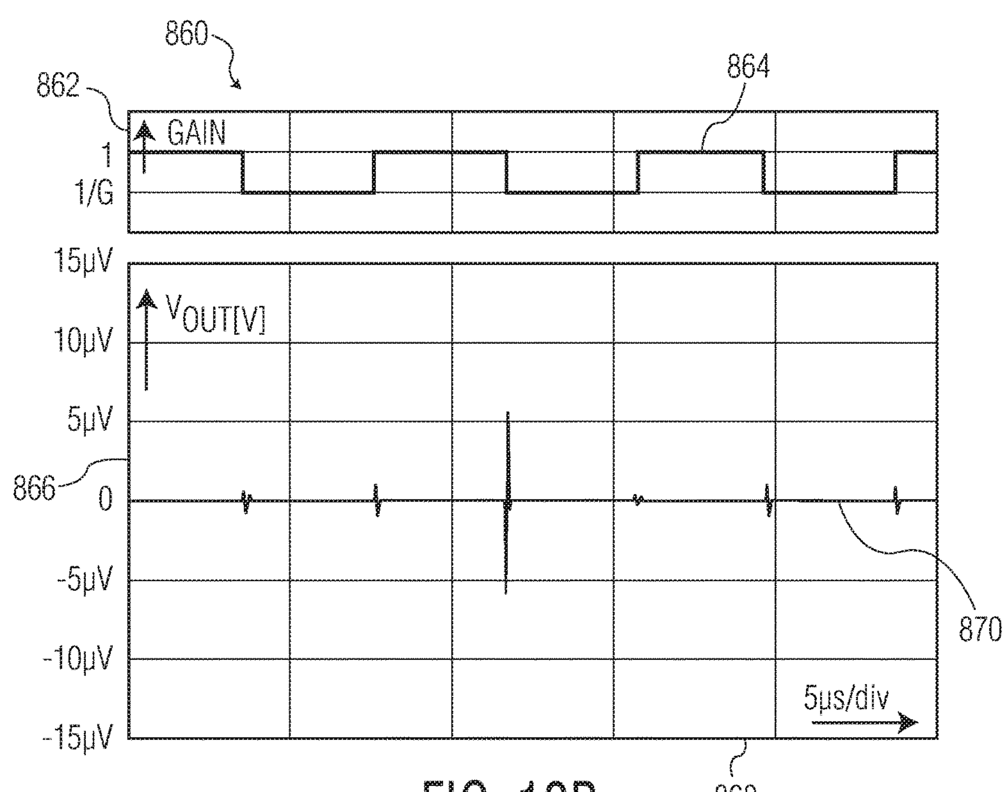
FIG. 12B shows a graph of the output noise voltage when switching gain values in the analog feedback loop of a class-D amplifier.

This difference in the transient response is shown for example in FIG. 12B. FIG. 12B shows a graph 860 having a first y axis 862 showing the gain switching and a second y axis 866 showing the output noise varying between −15 mV and +15 mv. An x-axis 868 is time shown in units of 5 ms per division. Line 864 shows the gain switching waveform between an analog gain factor of 1 (high power operating mode) and 1/G (low power operating mode). Line 870 shows the output noise voltage Vout response of the ITU-R 468 filter to the gain switching.

Figure 12C:
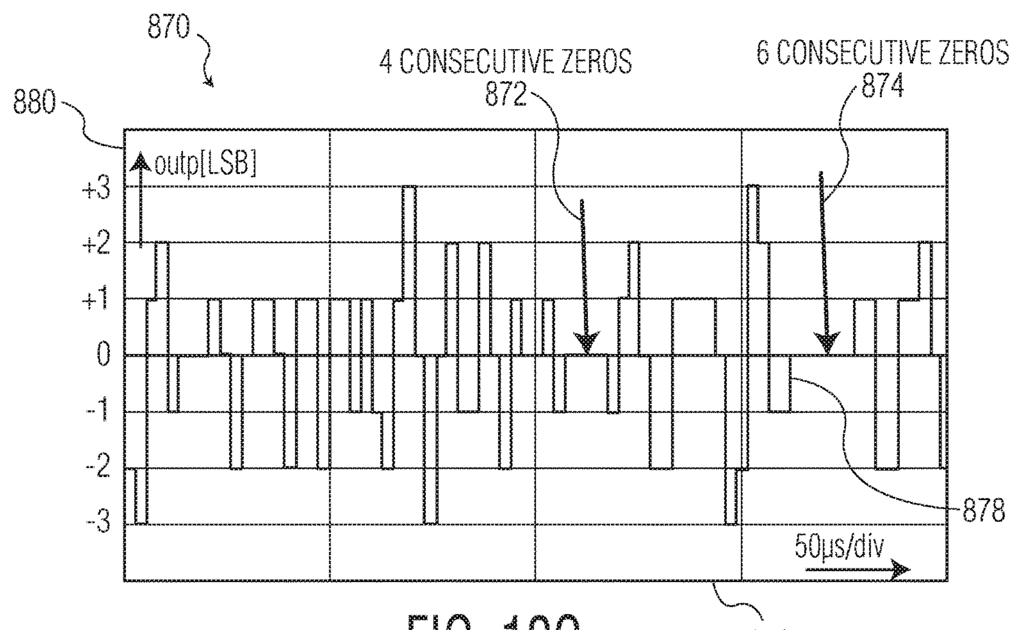
FIG. 12C shows an example output of a sigma-delay modulator.

FIG. 12C shows a graph 880 of the sigma delta output in least significant bits (LSB) on the y-axis 870 versus time on the x-axis 876 in 50 us per division. Line 878 shows the variation in output with points of 4 consecutive zeros indicated at 872 and 6 consecutive zeros indicated at 874.

Figure 12D:
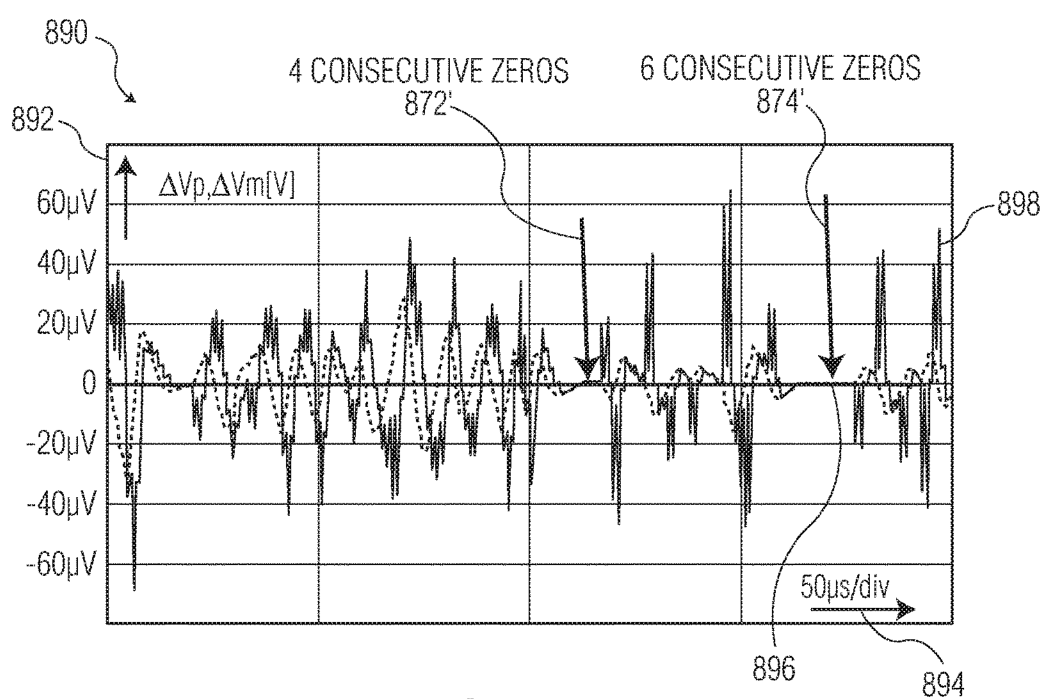
FIG. 12D shows the difference in output voltages between two first integrators and two second integrators in a differential analog feedback loop of a class-D amplifier.

FIG. 12D shows a graph 890 of corresponding variation in the difference $\Delta V_p$ between the output voltages of the first integrators $V_{ap}-V_{bp}$ in the analog class-D feedback loop 320 and the difference $\Delta V_m$ between the output voltages of the second integrators $V_{am}-V_{bm}$ in the analog class-D feedback loop 320 shown for the same time interval as shown in FIG. 12C. The y-axis 892 varies between −60 mV and +60 mV. The x-axis 894 represents time in 50 us per division. Line 896 shows the variation of $\Delta V_p$ over time and line 898 shows the variation of $\Delta V_m$ over time. As can be seen, these voltage differences tend towards zero when the sigma-delta modulator produces consecutive zero output samples at points 872' and 874'.

Figure 12E:
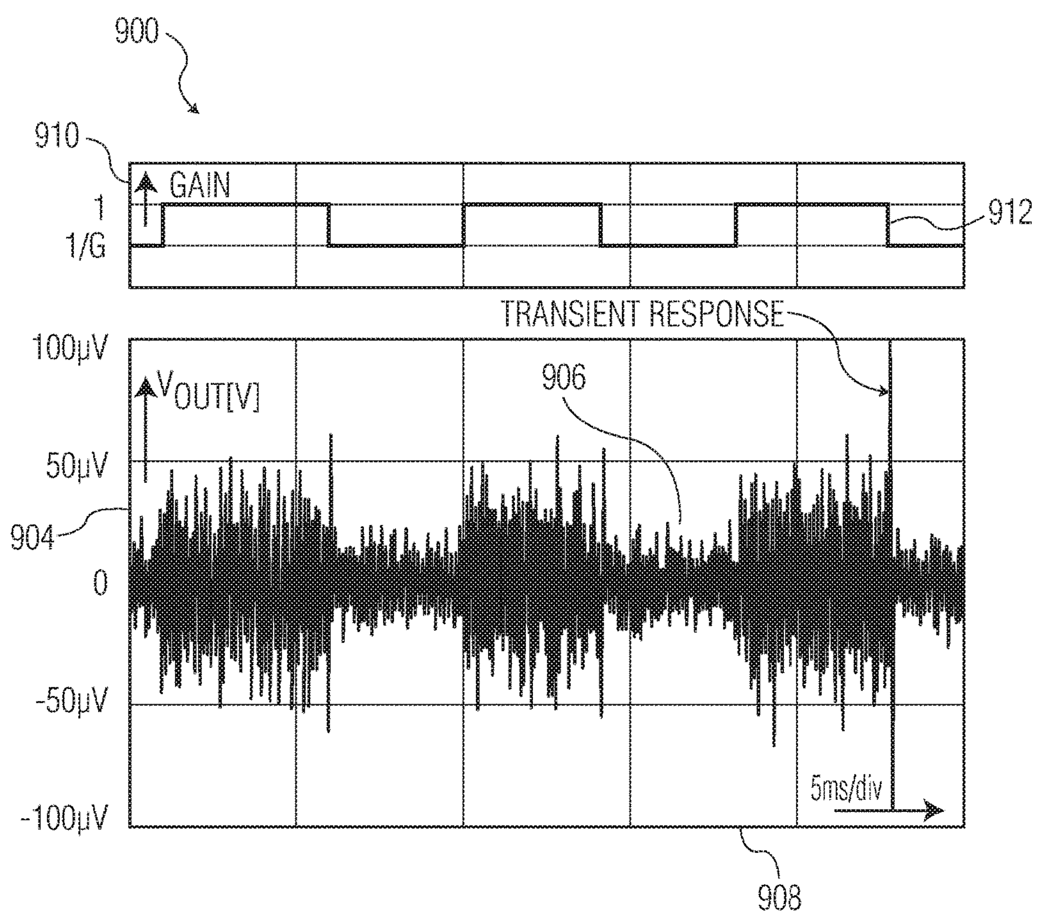
FIG. 12E shows a simulation of the noise voltage of the audio amplifier system of FIG. 11 in the different operating modes.

The effect of delaying the transition until consecutive zeros have been detected on the resulting filter response is shown in FIG. 12E which shows a graph 900 showing the switching between low-noise and high-power mode with synchronization to consecutive zeros.

Graph 900 has a first y axis 910 showing the gain switching and a second y axis 904 showing the output noise varying between −100 uV and +100 uv. The x-axis 908 represents time in 5 ms per division. Line 912 shows the gain switching waveform between an analog gain factor of 1 (high power operating mode) and 1/G (low power or low noise operating mode). Line 906 shows the voltage Vout at the output of the audio path.

As can be seen only a small mode transition response can be seen in the last transition from high-power to low-noise mode. The worst case response after a mode transition may be less than 5000. The average delay time between a mode transition command and the first occurrence of the corresponding sequence of consecutive zeros may be 100 μs for the low-noise to high-power transitions and 2 ms for the high-power to low-noise transitions.

Figure 13:
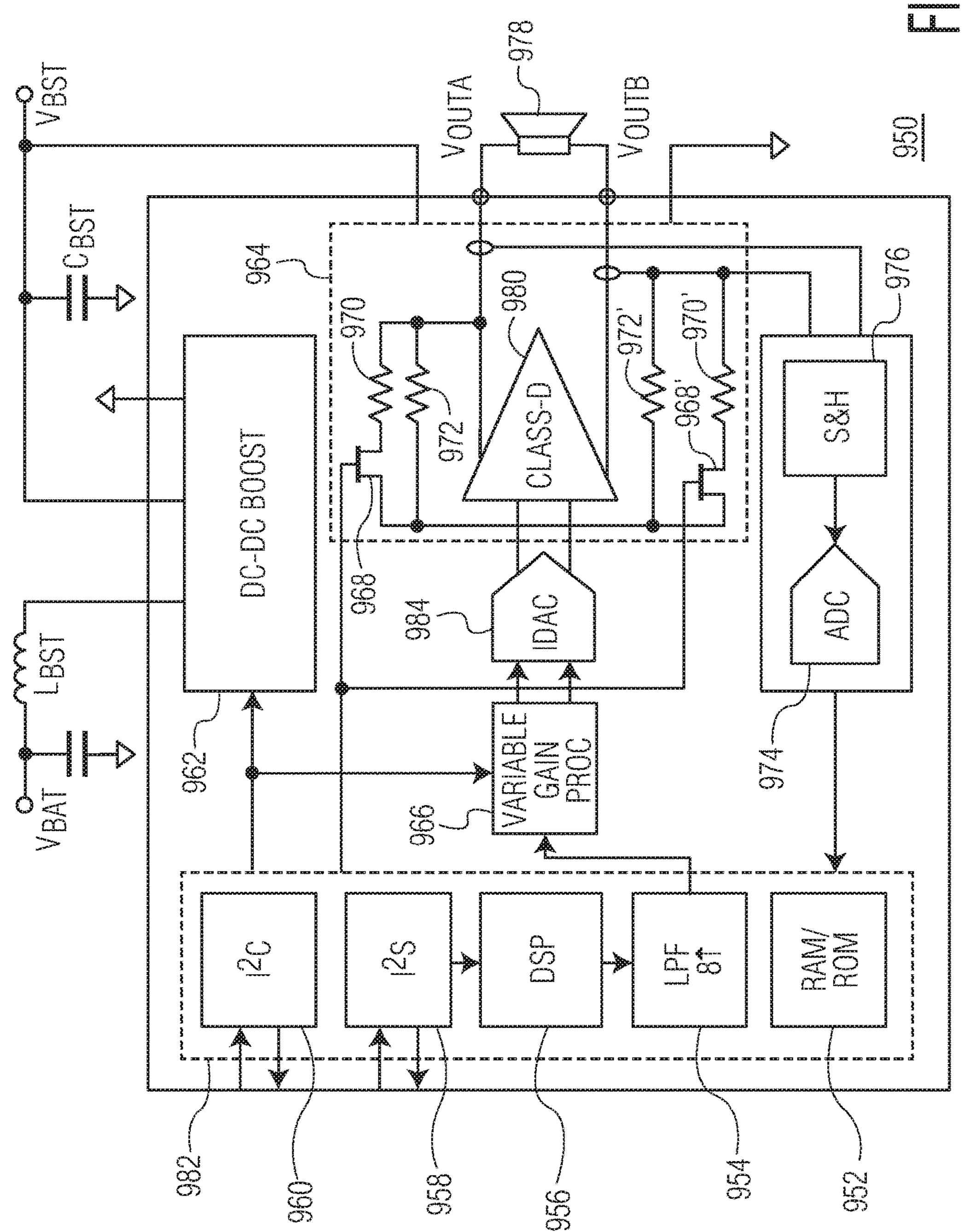
FIG. 13 illustrates an audio amplifier system according to an embodiment.

FIG. 13 illustrates an amplifier system 950 which may be implemented as an integrated circuit. The controller 982 may include an $I^2C$ interface 960, and $I^2S$ interface 958, a digital signal processor (DSP) 956, a low pass up-sampling filter 954, and a memory 952 which may include RAM and/or ROM. The skilled person will appreciate that the elements described in the controller 982 may be connected together via a control and/or data bus. An output of the controller 982 may be connected to a DC-DC boost circuit 962. The DC-DC boost circuit 962 may supply a boosted voltage to a variable gain class D amplifier 964.

A variable gain digital audio processor 966 which may include a sigma delta modulator and a digital pulse width modulator may have an input connected to an output of the low-pass up-sampling filter 710. The output of variable gain digital audio processor 966 may be connected to a digital to analog converter 984. The output of digital to analog converter 984 may be connected to the variable gain class D amplifier 964.

The variable gain class D amplifier 964 may include class-D amplifier circuit 980 having a pair of differential inputs and a pair of differential outputs. In operation, the differential outputs may be used to drive a speaker or loudspeaker 978. The variable gain class D amplifier 964 may further include a feedback path between each respective differential output and differential input has a parallel arrangement of a fixed resistances 972,972' and a series arrangement of a MOS transistor 968,968' and resistances 970,970' which will be referred to as switchable resistances. The gates of the MOS transistors 968,968' may be connected to the controller 982. The value of each of the fixed resistances 972,972' may be equal to each other, and denoted as $R_{FB}$. The value of each of the switchable resistances 970,970' may be a value of $R_{FB}/(G-1)$ where G is a value of gain factor which may be an integer value.

The outputs of the variable gain class D amplifier 964 may be connected to a sample and hold circuit 976. An output of the sample and hold circuit 976 may be connected to an input of analog to digital converter 974. An output of analog to digital converter 974 may be connected to the controller 982.

In a first operation mode, which may be termed a low power operation mode, the controller 982 may configure the DC-DC booster 962 in follower mode in which the output follows the supply from a battery Vbat, so the booster output voltage Vbst is approximately equal to the battery voltage supply Vbat. In this first low power or low noise operation mode, the controller 982 may control the variable gain processor 966 to apply a gain factor G to the audio signal. The controller 982 may switch on the MOS transistors 968,968'. In this case the effective feedback resistance value is that of the fixed resistances 972, 972' ($R_{FB}$) in parallel with that of the respective switchable resistors 970,970' ($R_F/(G-1)$) that is to say an effective value of RFB/G. Since the gain of the class-D amplifier is linearly dependent on the resistance value, the effective value of the feedback resistance has decreased by a factor G, the gain of the variable gain class-D amplifier 178 decreases by a factor of G.

In a second operation mode, which may be termed a high power operation mode, the controller may control the DC-DC booster 962 to deliver a boosted voltage $V_{bst}>V_{bat}$. This may be done for example in response to the controller detecting a higher input signal on the I2S input module 958. In this second high power operation mode, the controller 982 may control the variable gain processor 966 to apply a unity gain factor to the audio signal. Consequently the gain applied at this stage is reduced by a factor of G compared to the first low power operation mode. The controller 982 may switch off the MOS transistor 968,968'. In this case the effective feedback resistance value is that of the fixed resistances 972, 972', that is to say $R_{FB}$ which is a gain increase of a factor G compared with the first operation mode. Consequently the overall gain of the amplifier system 950 remains the same as the first low power operation mode.

By having a larger proportion of the overall gain in the digital domain at lower power supply values the overall noise in the amplifier system 950 may be reduced. At higher power supply values the noise may increase but since the high power operating mode may only be selected at larger input signal values, the overall signal to noise ratio of the audio amplifier system may still be the same.

An audio amplifier system is described herein comprising a variable gain audio processor for processing digital audio signal, a digital to analog converter coupled to the audio processor, and configured to receive the processed digital audio signal, a variable gain amplifier having an input coupled to the output of the digital to analog converter and operably connected to a power supply, a controller coupled to the variable gain audio processor and the variable gain amplifier and configured to switch the audio amplifier system between a first operating mode having a first power supply voltage value and a second operating mode having a second higher power supply voltage value; wherein the controller is operable in the first operating mode to set the audio amplifier system gain to a desired gain value and is further operable in the second operating mode to maintain the desired gain value by increasing the gain of the variable gain amplifier and decreasing the gain of the variable gain audio processor with respect to the first operating mode.

Examples of the amplifier system herein described may be incorporated into mobile devices such as mobile phones, smart watches and other wearable devices, laptops, tablet computers, hearing aids, portable medical devices, and portable audio players.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An audio amplifier system comprising:

a variable gain audio processor configured to receive a digital audio signal and output a processed digital audio signal, a digital to analog converter coupled to the audio processor, and configured to receive the processed digital audio signal, a variable gain amplifier having an input coupled to the output of the digital to analog converter and operably connected to a power supply having at least two power supply values, and a controller coupled to the variable gain audio processor and the variable gain amplifier and configured to switch the audio amplifier system between a first operating mode having a first power supply voltage value and a second operating mode having a second higher power supply voltage value;

wherein the controller is operable in the first operating mode to set the audio amplifier system gain to a predetermined gain value, and in the second operating mode to maintain the amplifier system gain at the predetermined gain value by increasing the gain of the variable gain amplifier and decreasing the gain of the variable gain audio processor with respect to the first operating mode;

wherein the variable gain audio processor further comprises a sigma-delta modulator;

wherein the controller further comprises a detector coupled to an output of the sigma-delta modulator; and wherein the controller is further configured to vary the gain of the variable gain audio processor and the variable gain amplifier in response to a predetermined number of consecutive zeros being detected in the processed digital signal.

2. The audio amplifier system of claim 1 wherein the controller is further operable to maintain the audio amplifier system gain by altering the gain of the variable gain amplifier by a gain factor and altering the gain of the variable gain audio processor by the reciprocal of the gain factor.

3. The audio amplifier system of claim 2 wherein the gain factor is an integer power of two.

4. The audio amplifier system of claim 1 wherein the digital to analog converter is a current mode digital to analog converter operably supplied with a reference current.

5. The audio amplifier system of claim 1 wherein the controller is further operable to switch from the second mode of operation to the first mode of operation and to maintain the audio amplifier system gain at the predetermined value by decreasing the gain of the variable gain amplifier and increasing the gain of the variable gain audio processor with respect to the second mode of operation.

6. The audio amplifier system of claim 1 wherein the variable gain amplifier is a class-D amplifier.

7. The audio amplifier system of claim 6, wherein the variable gain class-D amplifier further comprises a pair of differential inputs, a pair of differential outputs and a pair of variable feedback resistances, each variable feedback resistance being coupled between a respective one of the differential outputs and the differential inputs and wherein the variable resistance is coupled to the controller and wherein the controller is operable to control the gain of the variable gain class-D amplifier by varying feedback resistance value.

8. The audio amplifier system of claim 7 wherein each variable resistance comprises a series and/or parallel arrangement of a first fixed resistance and at least one further switchable resistor coupled to the controller.

9. The audio amplifier system of claim 1 wherein the variable gain audio processor comprises a gain corrector coupled to the controller, the gain corrector being selectable to increase the gain of the digital audio signal by a gain factor in the first operating mode and to apply a unity gain to the digital audio signal in the second operating mode.

10. The audio amplifier system of claim 9 wherein the sigma-delta modulator comprises the gain corrector arranged between a loop filter and a quantizer and a further gain corrector arranged in a feedback path of the sigma-delta modulator and coupled to the controller, wherein the further gain corrector is selectable to attenuate the processed digital audio signal by the gain factor in the first operating mode and to apply a unity gain to the processed digital audio signal in the second operating mode.

11. The audio amplifier system of claim 10 further comprising a synchronous delay element coupled to an output of the gain corrector and a delay error corrector coupled to the output of a synchronous delay element, the delay error corrector being configured to correct a delayed signal by:

dividing the signal from the delay element by a gain correction factor for a single clock cycle in response to a power supply voltage changing from the first power supply voltage value to the second higher power supply voltage value, multiplying the signal from the delay element by the gain correction factor for a single clock cycle in response to the power supply voltage changing from the second power supply voltage value to the first power supply voltage value, and outputting the delayed corrected signal to the digital to analog converter.

12. The audio amplifier system of claim 11 wherein the loop filter comprises the delay error corrector.

13. The audio amplifier system of claim 1 wherein the first operating mode is a low power operating mode and the second operating mode is a high power operating mode and wherein the controller is coupled to a dc-dc converter and is operable to switch the audio amplifier system from the low power operating mode to the high power operating mode in response to an increase in the level of the digital audio signal.

14. An audio amplifier system comprising:

a variable gain audio processor configured to receive a digital audio signal and output a processed digital audio signal;

a digital to analog converter coupled to the audio processor, and configured to receive the processed digital audio signal;

a variable gain amplifier having an input coupled to the output of the digital to analog converter and operably connected to a power supply having at least two power supply values; and a controller coupled to the variable gain audio processor and the variable gain amplifier and configured to switch the audio amplifier system between a first operating mode having a first power supply voltage value and a second operating mode having a second higher power supply voltage value;

wherein the controller is operable in the first operating mode to set the audio amplifier system gain to a predetermined gain value, and in the second operating mode to maintain the amplifier system gain at the predetermined gain value by increasing the gain of the variable gain amplifier and decreasing the gain of the variable gain audio processor with respect to the first operating mode;

wherein the variable gain audio processor further comprises a sigma-delta modulator;

wherein the variable gain audio processor comprises a gain corrector coupled to the controller, the gain corrector being selectable to increase the gain of the digital audio signal by a gain factor in the first operating mode and to apply a unity gain to the digital audio signal in the second operating mode;

wherein the sigma-delta modulator comprises the gain corrector arranged between a loop filter and a quantizer and a further gain corrector arranged in a feedback path of the sigma-delta modulator and coupled to the controller; and wherein the further gain corrector is selectable to attenuate the processed digital audio signal by the gain factor in the first operating mode and to apply a unity gain to the processed digital audio signal in the second operating mode.

* * * * *